(12) United States Patent
Qing et al.

(10) Patent No.: US 12,347,390 B2
(45) Date of Patent: *Jul. 1, 2025

(54) SHIFT REGISTER WITH INPUT CIRCUIT, OUTPUT CIRCUIT AND POTENTIAL STABILIZATION CIRCUIT, METHOD OF DRIVING THE SAME, SCAN DRIVING CIRCUIT AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haigang Qing, Beijing (CN); Yunsheng Xiao, Beijing (CN); Quanyong Gu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/589,959

(22) Filed: Feb. 28, 2024

(65) Prior Publication Data
US 2024/0203360 A1 Jun. 20, 2024

Related U.S. Application Data

(63) Continuation of application No. 17/789,268, filed as application No. PCT/CN2021/095584 on May 24, 2021, now Pat. No. 11,948,513.

(51) Int. Cl.
G09G 3/3266 (2016.01)
G11C 19/28 (2006.01)

(52) U.S. Cl.
CPC ........... *G09G 3/3266* (2013.01); *G11C 19/28* (2013.01); *G09G 2300/0426* (2013.01);
(Continued)

(58) Field of Classification Search
CPC ......... G09G 3/3266; G09G 2300/0426; G09G 2300/0852; G09G 2310/0267;
(Continued)

(56) References Cited

U.S. PATENT DOCUMENTS 11,741,902 B2  8/2023 Huang et al.
2013/0088265 A1  4/2013 Chen
(Continued)

FOREIGN PATENT DOCUMENTS

CN  104299595 A  1/2015
CN  105741802 A  7/2016
(Continued)

OTHER PUBLICATIONS

Extended European Search Report, EP 21942200.3, Nov. 8, 2023.
(Continued)

*Primary Examiner* — Adam J Snyder
(74) *Attorney, Agent, or Firm* — The Webb Law Firm

(57) ABSTRACT

A shift register includes a first control circuit configured to, according to one of a second clock signal and a first voltage signal, control a voltage of a second node under control of a voltage of the first node and the second clock signal; and a holding circuit configured to transmit the first voltage signal to an output signal terminal under control of the voltage of the second node. The first control circuit includes a third transistor and a second capacitor. A control electrode of the third transistor is electrically connected to the first node, a first electrode of the third transistor is electrically connected to the first voltage signal terminal, and a second electrode of the third transistor is electrically connected to a
(Continued)

third node. First and second ends of the second capacitor are electrically connected to the second clock signal terminal and the third node, respectively.

15 Claims, 9 Drawing Sheets

(52) U.S. Cl.
CPC ............. *G09G 2300/0852* (2013.01); *G09G 2310/0267* (2013.01); *G09G 2310/0286* (2013.01); *G09G 2310/0294* (2013.01); *G09G 2330/021* (2013.01)

(58) Field of Classification Search
CPC ... G09G 2310/0286; G09G 2310/0294; G09G 2330/021; G11C 19/28
See application file for complete search history.

(56) References Cited

U.S. PATENT DOCUMENTS

| | | |
|---|---|---|
| 2017/0278450 A1 | 9/2017 | Ma |
| 2019/0096306 A1* | 3/2019 | Kong .................... G11C 19/28 |
| 2020/0027389 A1* | 1/2020 | Kang .................... G09G 3/3266 |
| 2020/0066209 A1 | 2/2020 | Zhang et al. |
| 2020/0265877 A1* | 8/2020 | Zheng .................... G11C 19/28 |
| 2021/0174846 A1 | 6/2021 | Zheng |
| 2021/0358367 A1 | 11/2021 | Zheng |
| 2022/0230593 A1 | 7/2022 | Huang et al. |
| 2022/0406234 A1 | 12/2022 | Cheng |

FOREIGN PATENT DOCUMENTS

| | | | | |
|---|---|---|---|---|
| CN | 105976749 A | | 9/2016 | |
| CN | 107424649 A | * | 12/2017 | ........... G09G 3/3225 |
| CN | 110176204 A | * | 8/2019 | ............... G09G 3/20 |
| CN | 110660362 A | | 1/2020 | |
| CN | 111145678 A | | 5/2020 | |
| CN | 111210754 A | | 5/2020 | |
| CN | 111210776 A | | 5/2020 | |
| CN | 210692046 U | | 6/2020 | |
| CN | 112634805 A | | 4/2021 | |
| EP | 3816984 A1 | | 5/2021 | |
| KR | 1020080008800 A | | 1/2008 | |
| WO | 2013026387 A1 | | 2/2013 | |

OTHER PUBLICATIONS

International Search Report and Written Opinion, PCT/CN2021/095584, Feb. 18, 2022.
Jin, Xiangliang et al., "PSPICE Simulation of New Low-power Quasi-dynamic Shift Register for CMOS Pixel Readout Scan Circuit", Research & Progress of SSE, Feb. 2004, vol. 24, No. 1.
Non-Final Office Action, U.S. Appl. No. 17/789,268, filed Aug. 14, 2023.
Notice of Allowance and Fee(s) Due, U.S. Appl. No. 17/789,268, filed Nov. 28, 2023.
Song, Seok-Jeong et al., "Low power low temperature poly-Si thin-film transistor shift register with DC-type output driver", Solid-State Electronics, 2015, pp. 204-209, vol. 111.

* cited by examiner

SHIFT REGISTER WITH INPUT CIRCUIT, OUTPUT CIRCUIT AND POTENTIAL STABILIZATION CIRCUIT, METHOD OF DRIVING THE SAME, SCAN DRIVING CIRCUIT AND DISPLAY DEVICE

CROSS-REFERENCE TO RELATED APPLICATIONS

This application is a continuation of U.S. patent application Ser. No. 17/789,268, filed Jun. 27, 2022, which is the United States national phase of International Patent Application No. PCT/CN2021/095584, filed May 24, 2021, the disclosures of which are hereby incorporated by reference in their entireties.

BACKGROUND OF THE INVENTION

Field of the Invention

The present disclosure relates to the field of display technologies, and in particular, to a shift register and a method of driving the same, a scan driving circuit, and a display device.

Description of Related Art

A scan driving circuit is an important component in a display device. The scan driving circuit may include a plurality of shift registers that are cascaded, and the plurality of shift registers may be electrically connected to a plurality of lines in the display device. The scan driving circuit may input scan signals to the plurality of lines (e.g., gate lines or enable signal lines) in the display device one by one, so that the display device can display images.

By providing the scan driving circuit in the display device, it may be possible to effectively reduce costs and improve the yield.

SUMMARY OF THE INVENTION

In an aspect, a shift register is provided. The shift register includes a first control circuit and a holding circuit. The first control circuit is electrically connected to a first node, a first voltage signal terminal, a second clock signal terminal and a second node. The first control circuit is configured to, according to one of a second clock signal received at the second clock signal terminal and a first voltage signal transmitted by the first voltage signal terminal, control a voltage of the second node under control of a voltage of the first node and the second clock signal. The holding circuit is electrically connected to the second node, the first voltage signal terminal and an output signal terminal. The holding circuit is configured to transmit the first voltage signal to the output signal terminal under control of the voltage of the second node. The first control circuit includes a third transistor and a second capacitor. A control electrode of the third transistor is electrically connected to the first node, a first electrode of the third transistor is electrically connected to the first voltage signal terminal, and a second electrode of the third transistor is electrically connected to a third node. A first end of the second capacitor is electrically connected to the second clock signal terminal, and a second end of the second capacitor is electrically connected to the third node.

In some embodiments, the first control circuit includes a first control sub-circuit and a second control sub-circuit. The first control sub-circuit includes the third transistor and the second capacitor. The first control sub-circuit is configured to, according to one of the second clock signal and the first voltage signal, control a voltage of the third node under the control of the voltage of the first node and the second clock signal. The second control sub-circuit is electrically connected to the first node, the third node, the first voltage signal terminal, the second clock signal terminal and the second node; the second control sub-circuit is configured to, according to one of the second clock signal and the first voltage signal, control the voltage of the second node under control of the voltage of the first node and the voltage of the third node.

In some embodiments, the first control sub-circuit includes a third transistor and a second capacitor. A control electrode of the third transistor is electrically connected to the first node, a first electrode of the third transistor is electrically connected to the first voltage signal terminal, and a second electrode of the third transistor is electrically connected to the third node. A first end of the second capacitor is electrically connected to the second clock signal terminal, and a second end of the second capacitor is electrically connected to the third node.

In some embodiments, the second control sub-circuit includes a fourth transistor and a fifth transistor. A control electrode of the fourth transistor is electrically connected to the first node, a first electrode of the fourth transistor is electrically connected to the first voltage signal terminal, and a second electrode of the fourth transistor is electrically connected to the second node. A control electrode of the fifth transistor is electrically connected to the third node, a first electrode of the fifth transistor is electrically connected to the second clock signal terminal, and a second electrode of the fifth transistor is electrically connected to the second node.

In some embodiments, the shift register further includes a potential stabilization circuit. The potential stabilization circuit is electrically connected to the first node, a second voltage signal terminal and a fourth node; the potential stabilization circuit is configured to transmit the input signal from the first node to the fourth node under control of a second voltage signal transmitted by the second voltage signal terminal, and stabilize a voltage of the fourth node. The output circuit is electrically connected to the fourth node, so that the output circuit is electrically connected to the first node through the potential stabilization circuit.

In some embodiments, the potential stabilization circuit includes a seventh transistor. A control electrode of the seventh transistor is electrically connected to the second voltage signal terminal, a first electrode of the seventh transistor is electrically connected to the first node, and a second electrode of the seventh transistor is electrically connected to the fourth node.

In some embodiments, the shift register further includes a second control circuit. The second control circuit is electrically connected to the second node, the first voltage signal terminal and the first node; and the second control circuit is configured to transmit the first voltage signal to the first node under the control of the voltage of the second node.

In some embodiments, the second control circuit includes an eighth transistor. A control electrode of the eighth transistor is electrically connected to the second node, a first electrode of the eighth transistor is electrically connected to the first voltage signal terminal, and a second electrode of the eighth transistor is electrically connected to the first node.

In some embodiments, the shift register further includes a third control circuit. The third control circuit is electrically connected to the second clock signal terminal, a fifth node and the first node; the second control circuit is electrically connected to the fifth node, so that the second control circuit is electrically connected to the first node through the third control circuit. The second control circuit is configured to transmit the first voltage signal to the fifth node under the control of the voltage of the second node. The third control circuit is configured to transmit the first voltage signal from the fifth node to the first node under control of the second clock signal.

In some embodiments, the third control circuit includes a ninth transistor. A control electrode of the ninth transistor is electrically connected to the second clock signal terminal, a first electrode of the ninth transistor is electrically connected to the fifth node, and a second electrode of the ninth transistor is electrically connected to the first node. The second control circuit includes an eighth transistor, a control electrode of the eighth transistor is electrically connected to the second node, a first electrode of the eighth transistor is electrically connected to the first voltage signal terminal, and a second electrode of the eighth transistor is electrically connected to the fifth node.

In some embodiments, the shift register further includes an input circuit and an output circuit. The input circuit is electrically connected to a first clock signal terminal, an input signal terminal and the first node. The input circuit is configured to transmit an input signal received at the input signal terminal to the first node under control of a first clock signal transmitted by the first clock signal terminal. The output circuit is electrically connected to the first node, the second clock signal terminal and the output signal terminal. The output circuit is configured to transmit the second clock signal received at the second clock signal terminal to the output signal terminal under control of a voltage of the first node.

In some embodiments, the input circuit includes a first transistor. A control electrode of the first transistor is electrically connected to the first clock signal terminal, a first electrode of the first transistor is electrically connected to the input signal terminal, and a second electrode of the first transistor is electrically connected to the first node.

In some embodiments, the output circuit includes a second transistor and a first capacitor. A control electrode of the second transistor is electrically connected to the first node, a first electrode of the second transistor is electrically connected to the second clock signal terminal, and a second electrode of the second transistor is electrically connected to the output signal terminal. A first end of the first capacitor is electrically connected to the first node, and a second end of the first capacitor is electrically connected to the output signal terminal; or, the shift register further includes a potential stabilization circuit including a seventh transistor; the control electrode of the second transistor is electrically connected to the seventh transistor, the first electrode of the second transistor is electrically connected to the second clock signal terminal, and the second electrode of the second transistor is electrically connected to the output signal terminal; and the first end of the first capacitor is electrically connected to the control electrode of the second transistor, and the second end of the first capacitor is electrically connected to the output signal terminal.

In some embodiments, the holding circuit includes a sixth transistor and a third capacitor. A control electrode of the sixth transistor is electrically connected to the second node, a first electrode of the sixth transistor is electrically connected to the first voltage signal terminal, and a second electrode of the sixth transistor is electrically connected to the output signal terminal. A first end of the third capacitor is electrically connected to the second node, and a second end of the third capacitor is electrically connected to the first voltage signal terminal.

In some embodiments, a plurality of transistors included in the shift register are of a same conduction type.

In some embodiments, the first clock signal and the second clock signal are inverted signals.

In another aspect, a method of driving the shift register as described in any of the above embodiments is provided. The method includes a first period and a second period. In the first period, under the control of the voltage of the first node and the second clock signal, the first control circuit transmits the first voltage signal transmitted by the first voltage signal terminal to the second node, so as to control the voltage of the second node; and under the control of the voltage of the second node, the holding circuit is turned off. In the second period, under the control of the voltage of the first node and the second clock signal, the first control circuit transmits the second clock signal to the second node, so as to control the voltage of the second node; and under the control of the voltage of the second node, the holding circuit is turned on and transmits the first voltage signal to the output signal terminal.

In some embodiments, the shift register further includes an input circuit and an output circuit, the input circuit is electrically connected to a first clock signal terminal, an input signal terminal and the first node, and the output circuit is electrically connected to the first node, the second clock signal terminal and the output signal terminal. In the first period, in response to a level of a first clock signal received at the first clock signal terminal, the input circuit is turned on and transmits a level of an input signal received at the input signal terminal to the first node; and under the control of the voltage of the first node, the output circuit is turned on and transmits the second clock signal received at the second clock signal terminal to the output signal terminal. In the second period, in response to the level of the first clock signal received at the first clock signal terminal, the input circuit is turned on and transmits another level of the input signal received at the input signal terminal to the first node; and under the control of the voltage of the first node, the output circuit is turned off.

In some embodiments, the first period includes an input period and a scanning period. In the input period, in response to the level of the first clock signal, the input circuit is turned on and transmits the level of the input signal to the first node; under the control of the voltage of the first node, the output circuit is turned on and transmits a level of the second clock signal to the output signal terminal; under the control of the voltage of the first node and the level of the second clock signal, the first control circuit transmits the first voltage signal to the second node, so as to control the voltage of the second node; and under the control of the voltage of the second node, the holding circuit is turned off. In the scanning period, in response to another level of the first clock signal, the input circuit is turned off; the voltage of the first node remains substantially unchanged, and under the control of the voltage of the first node, the output circuit remains in an on state and transmits another level of the second clock signal to the output signal terminal; under the control of the voltage of the first node and the another level of the second clock signal, the first control circuit transmits the first voltage signal to the second node, so as to control the voltage of the second node; and under the control of the voltage of the second node, the holding circuit is turned off. The second period includes a first holding period and a second holding period. In the first holding period, in response to the level of the first clock signal, the input circuit is turned on and transmits the another level of the input signal to the first node; under the control of the voltage of the first node, the output circuit is turned off; under the control of the voltage of the first node and the level of the second clock signal, the first control circuit transmits the level of the second clock signal to the second node, so as to control the voltage of the second node; and under the control of the voltage of the second node, the holding circuit is turned off. In the second holding period, in response to the another level of the first clock signal, the input circuit is turned off; the voltage of the first node remains substantially unchanged, and under the control of the voltage of the first node, the output circuit remains in an off state; under the control of the voltage of the first node and the another level of the second clock signal, the first control circuit transmits the another level of the second clock signal to the second node, so as to control the voltage of the second node; and under the control of the voltage of the second node, the holding circuit is turned on and transmits the first voltage signal to the output signal terminal.

In yet another aspect, a scan driving circuit is provided. The scan driving circuit includes a plurality of shift registers connected in cascade as described in any of the above embodiments. The shift register further includes an input circuit and an output circuit, the input circuit is electrically connected to a first clock signal terminal, an input signal terminal and the first node, and the output circuit is electrically connected to the first node, the second clock signal terminal and the output signal terminal. Except for last i shift registers, an output signal terminal of an Nth shift register is electrically connected to an input signal terminal of an (N+i)th shift register. N and i are both positive integers, and i is less than N.

In some embodiments, the scan driving circuit further includes at least one first clock signal line and at least one second clock signal line. In a case where i is equal to 1, a first clock signal line is electrically connected to a first clock signal terminal of a (2N−1)th shift register and a second clock signal terminal of a (2N)th shift register; and a second clock signal line is electrically connected to a second clock signal terminal of the (2N−1)th shift register and a first clock signal terminal of the (2N)th shift register.

In yet another aspect, a display device is provided. The display device includes the scan driving circuit as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DESCRIPTION OF THE INVENTION

Figure 1:
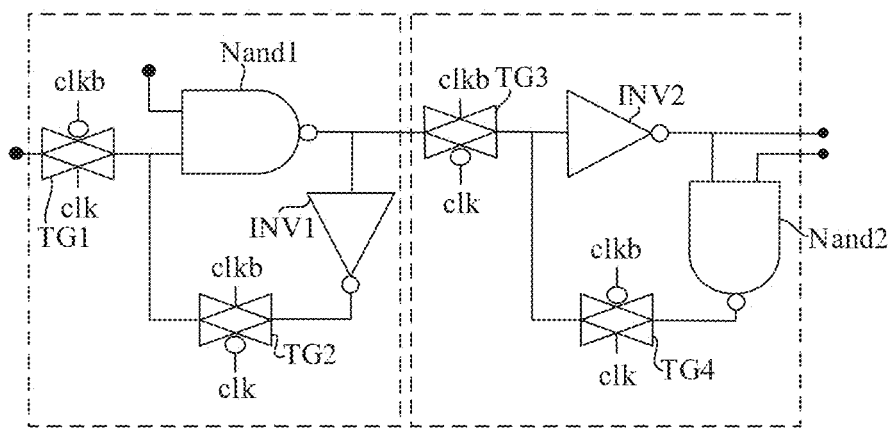
FIG. 1 is a structural diagram of a shift register, in accordance with the related art.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the quantity of indicated technical features. Thus, features defined with the terms such as "first" and "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phrase "based on" as used herein is meant to be open and inclusive, since a process, step, calculation or other action that is "based on" one or more of the stated conditions or values may, in practice, be based on additional conditions or values beyond those stated.

As used herein, the terms such as "about" or "approximately" include a stated value and an average value within an acceptable range of deviation of a particular value. The acceptable range of deviation is determined by a person of ordinary skill in the art, in consideration of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thickness of layers and sizes of regions are enlarged for clarity. Therefore, variations in shapes relative to the accompanying drawings due to, for example, manufacturing technologies and/or tolerances may be envisaged. Therefore, the exemplary embodiments should not be construed as being limited to the shapes of the regions shown herein, but including deviations in shape due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Transistors used in circuits provided by the embodiments of the present disclosure may be thin film transistors, field effect transistors or other switching devices with the same properties, and the embodiments of the present disclosure are described by taking thin film transistors as an example.

In some embodiments, a control electrode of each transistor used in a shift register is a gate of the transistor, a first electrode of the transistor is one of a source and a drain of the transistor, and a second electrode of the transistor is the other of the source and the drain of the transistor. Since the source and the drain of the transistor may be symmetrical in structure, the source and the drain thereof may be indistinguishable in structure. That is, the first electrode and the second electrode of the transistor in the embodiments of the present disclosure may be indistinguishable in structure. For example, in the case where the transistor is a P-type transistor, the first electrode of the transistor is the source, and the second electrode of the transistor is the drain. For example, in the case where the transistor is an N-type transistor, the first electrode of the transistor is the drain, and the second electrode of the transistor is the source.

In the circuits provided by the embodiments of the present disclosure, "nodes" do not represent actual components, but represent junctions of related electrical connections in a circuit diagram. That is to say, these nodes are nodes equivalent to junctions of relevant electrical connections in the circuit diagram.

Hereinafter, the circuits provided by the embodiments of the present disclosure are described by taking an example in which the transistors are all P-type transistors. It will be noted that, by adopting transistors of the same conduction type in the circuits mentioned below, it may be possible to simplify the process flow, reduce the difficulty of the process, and improve the yield of the products (e.g., a scan driving circuit and a display device).

Some embodiments of the present disclosure provide a shift register and a method of driving the same, a scan driving circuit, and a display device. The shift register, the method of driving the shift register, the scan driving circuit, and the display device are respectively described below.

Figure 2:
FIG. 2 is a structural diagram of a display device, in accordance with some embodiments of the present disclosure.

Some embodiments of the present disclosure provide the display device 2000, as shown in FIG. 2. The display device 2000 may be any device that displays an image whether in motion (e.g., a video) or stationary (e.g., a still image), and whether textual or graphical. More specifically, it is anticipated that the embodiments may be implemented in a variety of electronic devices or associated with a variety of electronic devices. The variety of electronic devices include (but are not limited to): mobile phones, wireless devices, personal data assistants (PDAs), hand-held or portable computers, GPS receivers/navigators, cameras, MP4 video players, video cameras, game consoles, watches, clocks, calculators, television monitors, flat panel displays, computer monitors, automobile displays (e.g., odometer displays), navigators, cockpit controllers and/or displays, displays of camera views (e.g., displays of rear-view cameras in vehicles), electronic photos, electronic billboards or signs, projectors, building structures, and packaging and aesthetic structures (e.g., displays for displaying an image of a piece of jewelry).

In some examples, the display device 2000 includes a frame, and a display panel PNL (as shown in FIG. 2), a circuit board, a data driver integrated circuit (IC) and other electronic components that are disposed in the frame.

The display panel PNL may be, for example, an organic light emitting diode (OLED) display panel, a quantum dot light emitting diode (QLED) display panel, a micro light emitting diode (micro LED) display panel, or a mini light emitting diode (mini LED) display panel, which is not limited in the present disclosure.

Some embodiments of the present disclosure are schematically described below by taking an example in which the display panel PNL is an OLED display panel.

Figure 3:
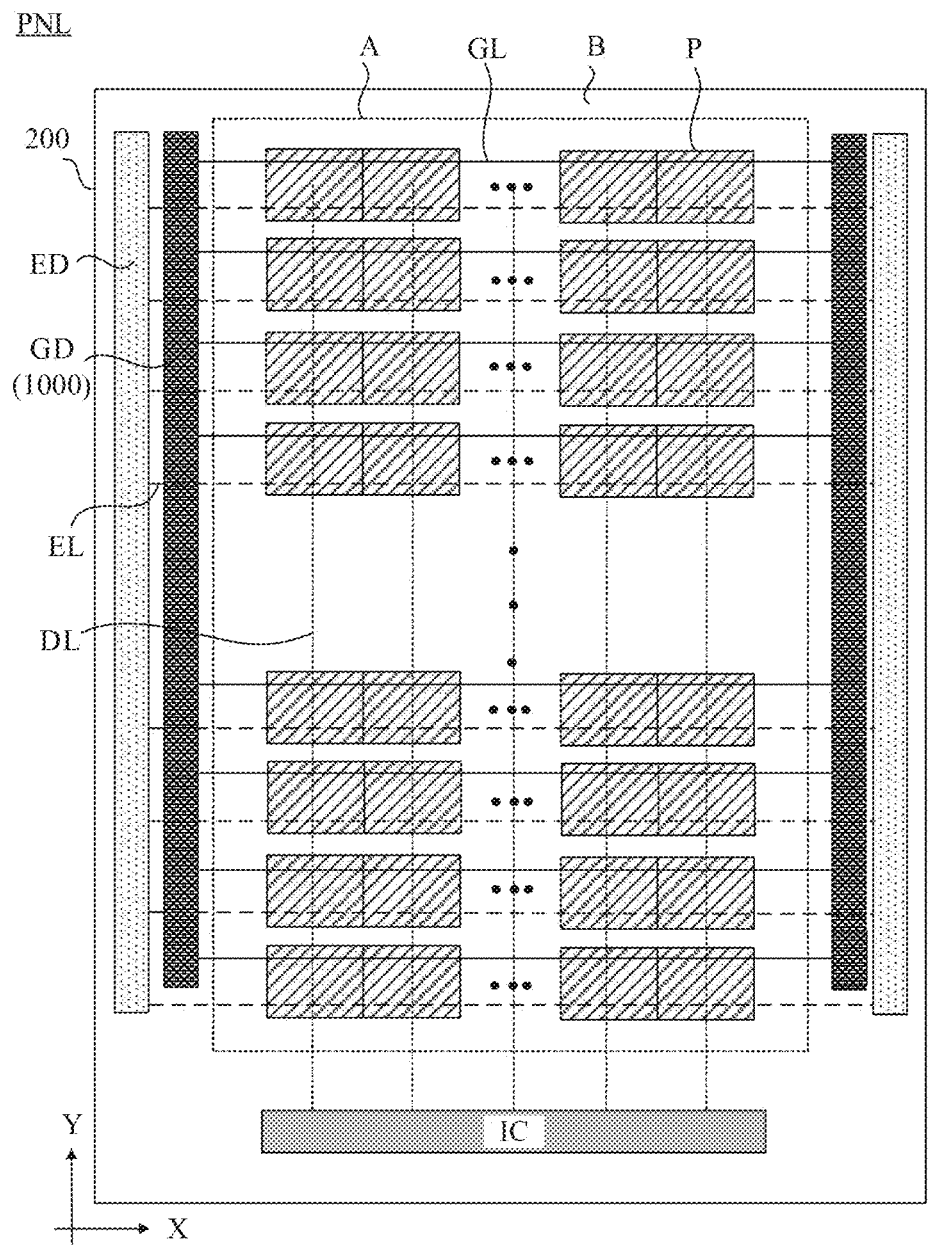
FIG. 3 is a structural diagram of a display panel, in accordance with some embodiments of the present disclosure.

In some embodiments, as shown in FIG. 3, the display panel PNL has a display area A and a border area B disposed beside the display area A. Here, the word "beside" refers to one side, two sides, three sides, or all sides of the display area A. That is, the border area B may be located on one side, two sides or three sides of the display area A, or the border area B may be disposed around the display area A.

In some examples, as shown in FIG. 3, the display panel PNL may include: a substrate 200, and a plurality of sub-pixels P, a plurality of gate lines GL, a plurality of data lines DL and a plurality of enable signal lines EL that are disposed on a side of the substrate 200.

The type of the substrate 200 may vary, which may be determined according to actual needs.

For example, the substrate 200 is a rigid substrate. The rigid substrate may be, for example, a glass substrate or a polymethyl methacrylate (PMMA) substrate.

For example, the substrate 200 is a flexible substrate. The flexible substrate may be, for example, a polyethylene terephthalate (PET) substrate, a polyethylene naphthalate (PEN) substrate or a polyimide (PI) substrate. In this case, the display panel PNL may be a flexible display panel.

Optionally, as shown in FIG. 3, the plurality of sub-pixels P, the plurality of gate lines GL, the plurality of data lines DL and the plurality of enable signal lines EL may be located in the display area A. The plurality of gate lines GL may extend along a first direction X, the plurality of data lines DL may extend along a second direction Y, and the plurality of enable signal lines EL may extend along the first direction X. The plurality of enable signal lines EL are, for example, disposed in a same layer as the plurality of gate lines GL.

Here, the first direction X and the second direction Y intersect. An angle between the first direction X and the second direction Y may be set according to actual needs. For example, the angle between the first direction X and the second direction Y is 85°, 88°, 90°, 92°, or 95°.

For example, the plurality of sub-pixels P are arranged in an array. That is, the plurality of sub-pixels P are, for example, arranged in a plurality of lines in the first direction X, and arranged in a plurality of lines in the second direction Y. Sub-pixels P arranged in a line in the first direction X may be referred to as the same row of sub-pixels P, and sub-pixels P arranged in a line in the second direction Y may be referred to as the same column of sub-pixels P. Sub-pixels in the same row may be electrically connected to at least one gate line GL and at least one enable signal line EL, and sub-pixels in the same column may be electrically connected to a data line DL. The number of enable signal lines EL and the number of gate lines GL electrically connected to the sub-pixels in the same row may be determined according to a structure of the sub-pixel. The embodiments of the present disclosure are described by taking an example in which the same row of sub-pixels P are electrically connected to a single gate line GL and a single enable signal line EL.

In some examples, as shown in FIG. 3, in the plurality of sub-pixels P, each sub-pixel P includes a pixel driving circuit and a light-emitting device electrically connected to the pixel driving circuit. In the case where the display panel PNL is an OLED display panel, the light-emitting device is an OLED.

The structure of the pixel driving circuit may vary, which may be determined according to actual needs. For example, the structure of the pixel driving circuit includes a structure of "4T1C", "6T1C", "7T1C", "6T2C", "7T2C", or "8T2C". Here, "T" represents a transistor, the number in front of "T" represents the number of transistors, "C" represents a storage capacitor, and the number in front of "C" represents the number of storage capacitors.

For example, the light-emitting device includes an anode, a light-emitting layer and a cathode that are sequentially stacked. In addition, the light-emitting device may further include, for example, a hole injection layer and/or a hole transport layer disposed between the anode and the light-emitting layer; and may further include, for example, an electron transport layer and/or an electron injection layer disposed between the light-emitting layer and the cathode. The pixel driving circuit is, for example, electrically connected to the anode of the light-emitting device.

The structure of the sub-pixel P and the connection relationship between the sub-pixel P and the gate line GL, the data line DL, and the enable signal line EL are schematically described below by taking an example in which the pixel driving circuit has a "7T1C" structure.

Figure 4:
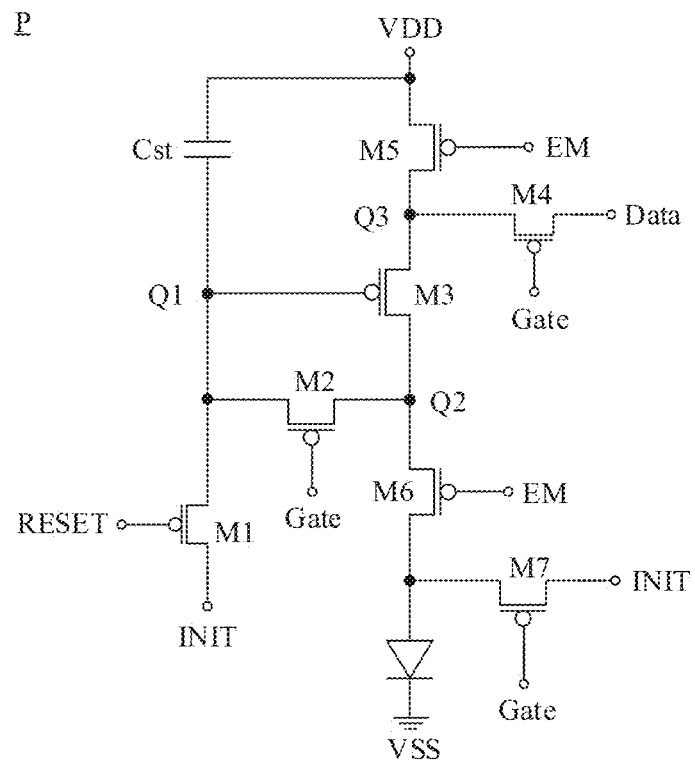
FIG. 4 is a circuit diagram of a sub-pixel, in accordance with some embodiments of the present disclosure.

For example, as shown in FIG. 4, the pixel driving circuit includes a first reset transistor M1, a compensation transistor M2, a driving transistor M3, a switching transistor M4, a first light-emitting control transistor M5, a second light-emitting control transistor M6, a second reset transistor M7, and a storage capacitor Cst.

For example, as shown in FIG. 4, a control electrode of the first reset transistor M1 is electrically connected to a reset signal terminal RESET, a first electrode of the first reset transistor M1 is electrically connected to an initial signal terminal INIT, and a second electrode of the first reset transistor M1 is electrically connected to a first pixel node Q1. The first reset transistor M1 is configured to transmit an initial signal received at the initial signal terminal INIT to the first pixel node Q1 under control of a reset signal transmitted by the reset signal terminal RESET, so as to reset the first pixel node Q1.

For example, as shown in FIG. 4, a control electrode of the compensation transistor M2 is electrically connected to a scan signal terminal Gate, a first electrode of the compensation transistor M2 is electrically connected to a second pixel node Q2, and a second electrode of the compensation transistor M2 is electrically connected to the first pixel node Q1. The compensation transistor M2 is configured to transmit a signal (e.g., a data signal) from the second pixel node Q2 to the first pixel node Q1 under control of a scan signal transmitted by the scan signal terminal Gate, so as to compensate a threshold voltage of the driving transistor T3.

For example, as shown in FIG. 4, a control electrode of the driving transistor M3 is electrically connected to the first pixel node Q1, a first electrode of the driving transistor M3 is electrically connected to a third pixel node Q3, and a second electrode of the driving transistor M3 is electrically connected to the second pixel node Q2. The driving transistor M3 is configured to transmit a signal (e.g., a data signal) from the third pixel node Q3 to the second pixel node Q2 under control of a voltage of the first pixel node Q1.

For example, as shown in FIG. 4, a control electrode of the switching transistor M4 is electrically connected to the scan signal terminal Gate, a first electrode of the switching transistor M4 is electrically connected to a data signal terminal Data, and a second electrode of the switching transistor M4 is electrically connected to the third pixel node Q3. The switching transistor M4 is configured to transmit a data signal transmitted by the data signal terminal Data to the third pixel node Q3 under the control of the scan signal transmitted by the scan signal terminal Gate.

For example, as shown in FIG. 4, a control electrode of the first light-emitting control transistor M5 is electrically connected to a light-emitting control signal terminal EM, a first electrode of the first light-emitting control transistor M5 is electrically connected to a first power supply signal terminal VDD, and a second electrode of the first light-emitting control transistor M5 is electrically connected to the third pixel node Q3. The first light-emitting control transistor M5 is configured to transmit a first power supply signal transmitted by the first power supply signal terminal VDD to the third pixel node Q3 under control of a light-emitting control signal transmitted by the light-emitting control signal terminal EM.

For example, as shown in FIG. 4, a control electrode of the second light-emitting control transistor M6 is electrically connected to the light-emitting control signal terminal EM, a first electrode of the second light-emitting control transistor M6 is electrically connected to the second pixel node Q2, and a second electrode of the second light-emitting control transistor M6 is electrically connected to the anode of the light-emitting device. The second light-emitting control transistor M6 is configured to transmit a signal (e.g., the first power supply signal) from the second pixel node Q2 to the anode of the light-emitting device under the control of the light-emitting control signal transmitted by the light-emitting control signal terminal EM.

For example, as shown in FIG. 4, a control electrode of the second reset transistor M7 is electrically connected to the scan signal terminal Gate, a first electrode of the second reset transistor M7 is electrically connected to the initial signal terminal INIT, and a second electrode of the second reset transistor M7 is electrically connected to the anode of the light-emitting device. The second reset transistor M7 is configured to transmit the initial signal received at the initial signal terminal INIT to the anode of the light-emitting device under the control of the scan signal transmitted by the scan signal terminal Gate, so as to reset the anode of the light-emitting device.

For example, as shown in FIG. 4, the cathode of the light-emitting device is electrically connected to a second power supply signal terminal VSS. The light-emitting device is configured to emit light under control of the first power supply signal and a second power supply signal transmitted by the second power supply signal terminal VSS.

For example, as shown in FIG. 4, a first end of the storage capacitor Cst is electrically connected to the first power supply signal terminal VDD, and a second end of the storage capacitor Cst is electrically connected to the first pixel node Q1. The storage capacitor Cst is configured to store a signal transmitted to the first pixel node Q1 and maintain the voltage of the first pixel node Q1.

For example, the pixel driving circuit may be electrically connected to a corresponding gate line GL through the scan signal terminal Gate, electrically connected to a corresponding data line DL through the data signal terminal Data, and electrically connected to a corresponding enable signal line EL through the light-emitting control signal terminal EM.

During the display process of the display panel PNL, the pixel driving circuit may receive a scan signal from the corresponding gate line GL, a data signal from the corresponding data line DL and an enable signal from the corresponding enable signal line EL, so as to generate a driving current. The driving current may be transmitted to the light-emitting device to drive the light-emitting device to emit light. The light-emitting devices of the plurality of sub-pixels cooperate to enable the display panel PNL to display images.

Here, the transistors in the pixel driving circuit may include, for example, at least one of a low temperature poly-silicon thin film transistor (LTPS TFT) and an oxide thin film transistor. The LTPS TFT has advantages of high mobility and fast charging, and the oxide thin film transistor has advantages of low leakage current and so forth. In the present example, the LTPS TFT and the oxide thin film transistor may be integrated in the same display panel to obtain a low temperature polycrystalline oxide (LTPO) display panel. In this way, the advantages of both transistors may be combined to achieve a high pixels per inch (PPI) and low frequency driving, thus reducing the power consumption and improving the display quality.

In some examples, as shown in FIG. 3, the data driver IC is located in the border area B, and is electrically connected to a plurality of data lines DL located in the display area A, so as to provide data signals to corresponding pixel driving circuits through the plurality of data lines DL.

In some examples, as shown in FIG. 3, the display panel PNL includes the scan driving circuit 1000. The scan driving circuit 1000 may be located on the same side of the substrate 200 as the plurality of sub-pixels P, the plurality of gate lines GL and the plurality of data lines DL.

The structure of the scan driving circuit 1000 may vary, which may be determined according to actual needs.

For example, the scan driving circuit 1000 is a gate driving circuit GD. The gate driving circuit GD is electrically connected to the plurality of gate lines GL, so as to provide scan signals to corresponding pixel driving circuits through the plurality of gate lines GL.

For example, the scan driving circuit 1000 is a light-emitting control circuit ED. The light-emitting control circuit ED is electrically connected to the plurality of enable signal lines EL, so as to provide enable signals to corresponding pixel driving circuits through the plurality of enable signal lines EL.

The position where the scan driving circuit 1000 is located may vary, which may be set according to actual needs.

For example, as shown in FIG. 3, the scan driving circuit 1000 is disposed in the border area B and located on at least one side of the display area A in an extending direction of the plurality of gate lines GL.

For example, at least a portion of the scan driving circuit 1000 is disposed in the display area A. In this way, it may be possible to recude an area occupied by the scan driving circuit 1000 in the border area B and thus reduce a size of the border area B, so that the display panel PNL and the display device 2000 may achieve a narrow border design.

Figure 15:
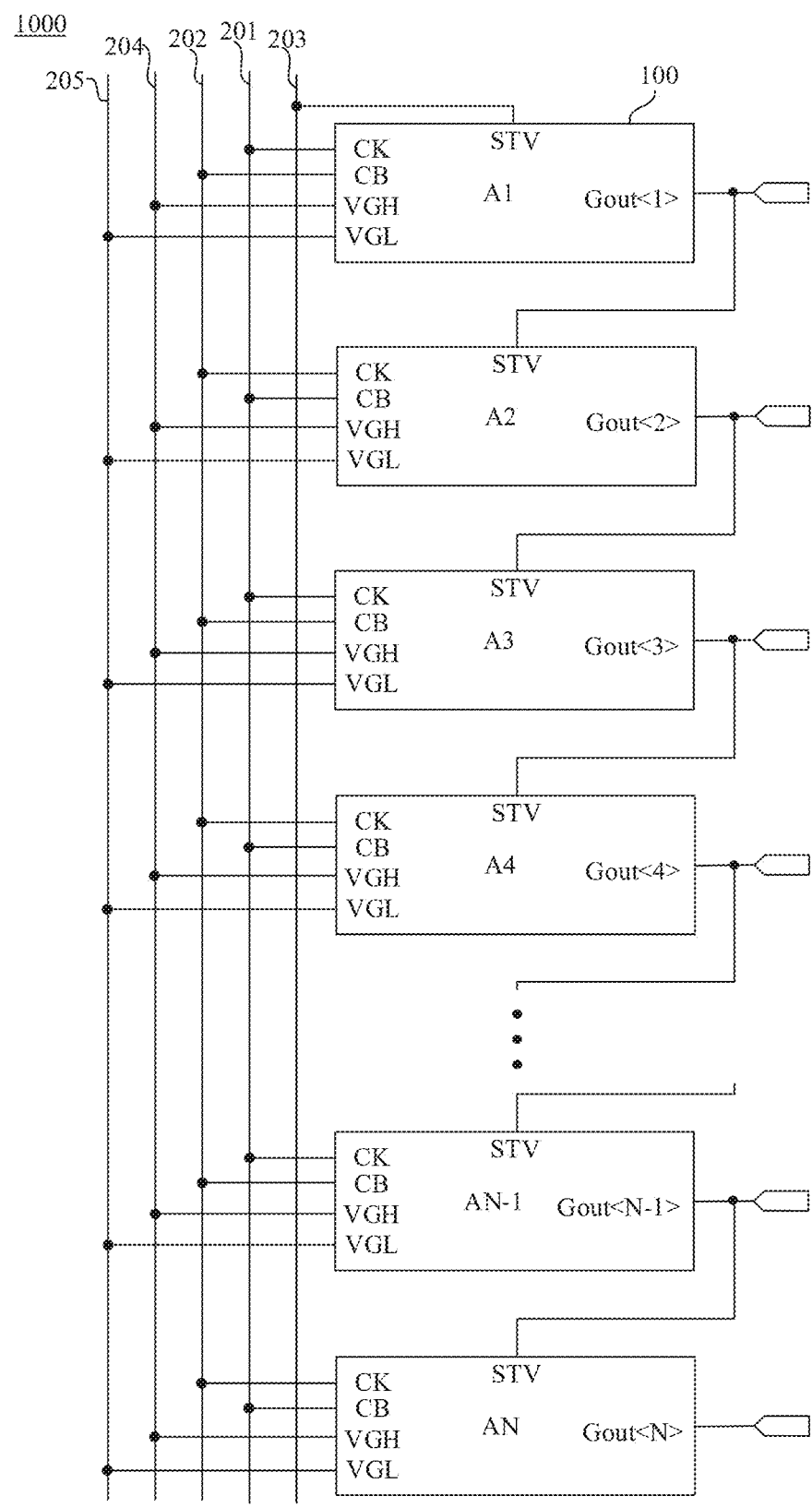
FIG. 15 is a structural diagram of a scan driving circuit, in accordance with some embodiments of the present disclosure.

A schematic description will be given below by taking an example in which the scan driving circuit 1000 is a gate driving circuit GD and is disposed in the border area B.

in some embodiments, as shown in FIG. 15, the scan driving circuit 1000 includes a plurality of shift registers 100 connected in cascade.

In some examples, the number of shift registers 100 included in the scan driving circuit 1000 may or may not be equal to the number of rows of the sub-pixels P.

For example, the number of shift registers 100 is equal to the number of rows of the sub-pixels P. Based on this, a single shift register 100 may be electrically connected to pixel driving circuits in a same row of sub-pixels P through a single gate line GL.

For example, the number of shift registers 100 is greater than the number of rows of the sub-pixels P. Based on this, a single shift register 100 may be electrically connected to pixel driving circuits in a same row of sub-pixels P though a single gate line GL, and output signal terminals Gout of remaining shift registers 100 not electrically connected to gate lines GL may be in a floating state. As for description of the output signal terminal Gout, reference may be made to the following description, and details will not be given here.

For another example, the number of shift registers 100 is less than the number of rows of the sub-pixels P. Based on this, a single shift register 100 may be electrically connected to pixel driving circuits in corresponding rows of sub-pixels P through gate lines GL.

The structure of the shift register 100 may vary, which may be determined according to actual needs. The structure of the shift register 100 will be schematically described below, but the structure of the shift register 100 provided in the embodiments of the present disclosure is not limited to the structure in the example given.

It will be noted that, the shift register 100 includes a plurality of transistors, and the plurality of transistors are of a same conduction type. For example, the plurality of transistors are all N-type transistors, or the plurality of transistors are all P-type transistors. Those skilled in the art will understand that, in a case where the transistors are of different types, corresponding timing diagrams may be different, and therefore the timing diagrams in the present disclosure are not limited thereto.

The plurality of transistors may be of the same type or different types. For example, the plurality of transistors may include LTPS TFTs, amorphous-silicon thin film transistors, or metal oxide thin film transistors.

The shift register 100 provided in the embodiments of the present disclosure is described below by taking an example where the transistors are all LTPS TFTs.

Figure 5:
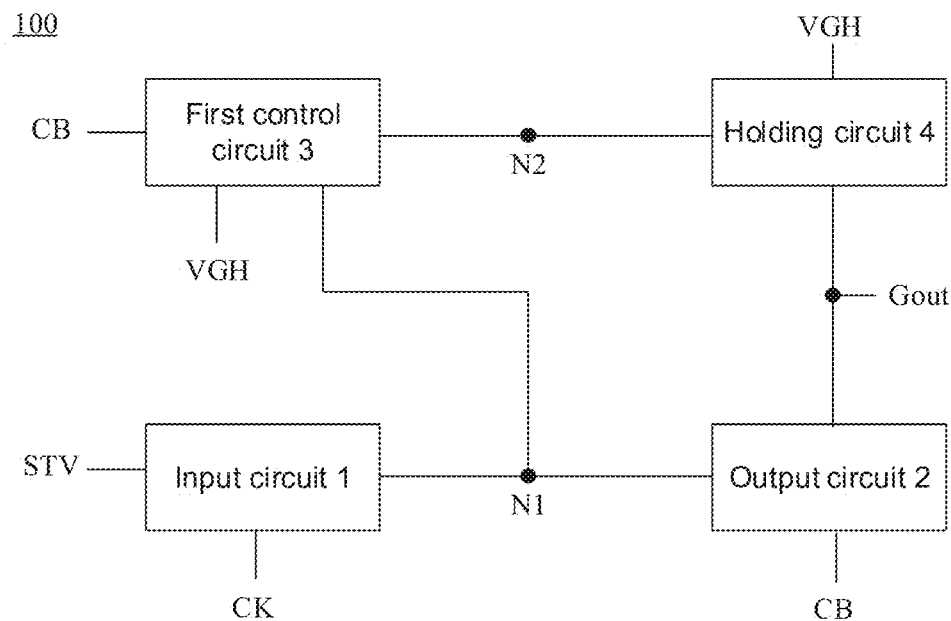
FIG. 5 is a structural diagram of a shift register, in accordance with some embodiments of the present disclosure.
Figure 6:
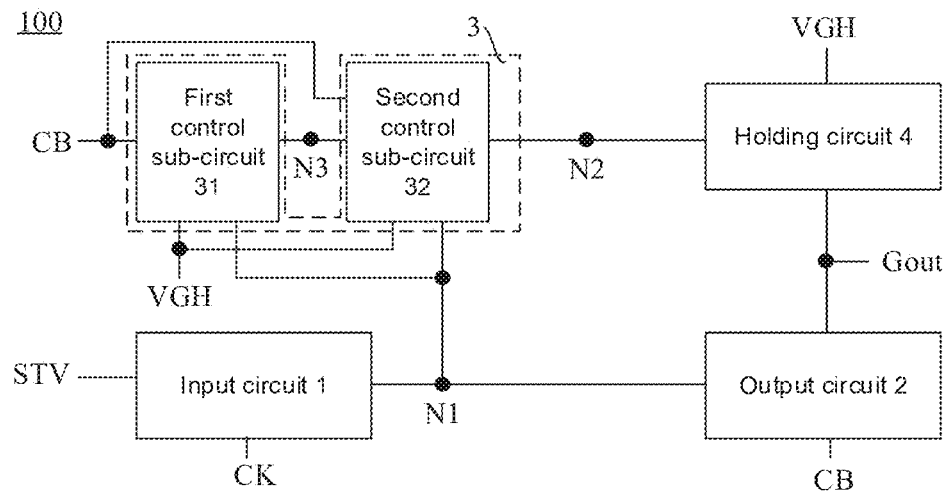
FIG. 6 is a structural diagram of another shift register, in accordance with some embodiments of the present disclosure.
Figure 7:
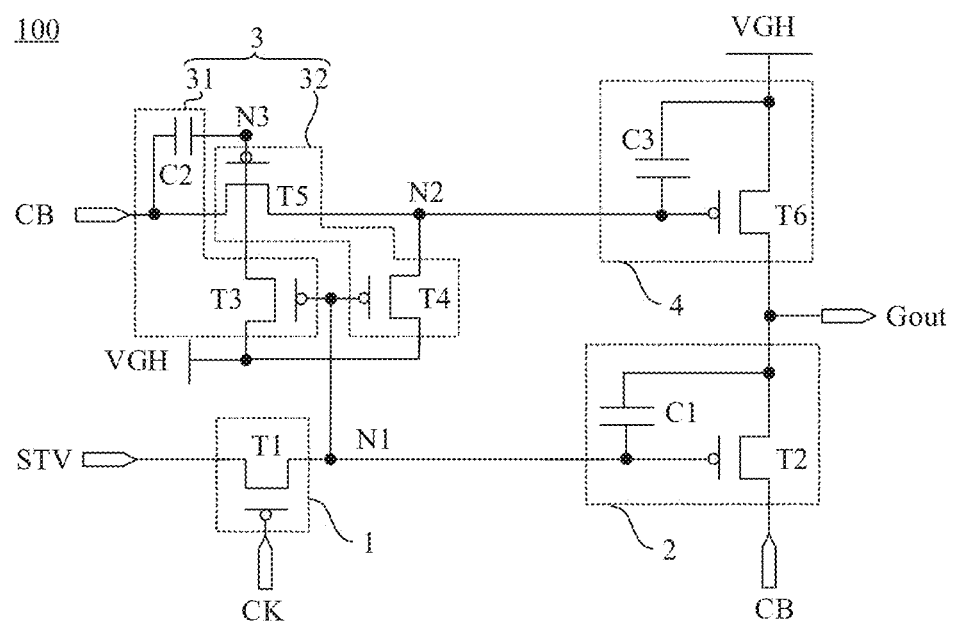
FIG. 7 is a circuit diagram of a shift register, in accordance with some embodiments of the present disclosure.

In some embodiments, as shown in FIGS. 5 to 7, the shift register 100 includes an input circuit 1, an output circuit 2, a first control circuit 3 and a holding circuit 4.

In some examples, as shown in FIGS. 5 to 7, the input circuit 1 is electrically connected to a first clock signal terminal CK, an input signal terminal STV and a first node N1. The input circuit 1 is configured to transmit an input signal received at the input signal terminal STV to the first node N1 under control of a first clock signal transmitted by the first clock signal terminal CK.

For example, in a case where the first clock signal is at a low level, the input circuit 1 is turned on under the control of the first clock signal, and transmits the input signal received at the input signal terminal STV to the first node N1, so as to charge the first node N1. In a case where the input signal is at a low level, a voltage of the first node N1 is at a low level; and in a case where the input signal is at a high level, the voltage of the first node N1 is at a high level.

In some examples, as shown in FIGS. 5 to 7, the output circuit 2 is electrically connected to the first node N1, a second clock signal terminal CB and an output signal terminal Gout. The output circuit 2 is configured to transmit a second clock signal received at the second clock signal terminal CB to the output signal terminal Gout under control of the voltage of the first node N1.

For example, in a case where the voltage of the first node N1 is at a low level, the output circuit 2 is turned on under the control of the voltage of the first node N1, and then receives the second clock signal and transmits it to the output signal terminal Gout.

Here, during a period when the output circuit 2 is turned on, the output signal terminal Gout may output the second clock signal as an output signal. The output signal is a scan signal received by the pixel driving circuit.

In some examples, as shown in FIGS. 5 to 7, the first control circuit 3 is electrically connected to the first node N1, a first voltage signal terminal VGH, the second clock signal terminal CB and a second node N2. The first control circuit 3 is configured to, according to a first voltage signal transmitted by one of the first voltage signal terminal VGH and the second clock signal, control a voltage of the second node N2 under control of the voltage of the first node N1 and the second clock signal.

Here, the first voltage signal terminal VGH is configured to transmit a direct current high-level signal (e.g., higher than or equal to a high-level portion of a clock signal); and the direct current high-level signal is referred to as the first voltage signal.

For example, in a case where the voltage of the first node N1 is at a low level, under control of the voltage of the first node N1, the first control circuit 3 receives the first voltage signal and transmits it to the second node N2 to charge the second node N2, so that the voltage of the second node N2 is at a high level. In a case where the voltage of the first node N1 is at a high level and the second clock signal is at a low level, under control of the second clock signal, the first control circuit 3 receives the second clock signal and transmits it to the second node N2 to charge the second node N2, so that the voltage of the second node N2 is at a low level.

In addition, in a case where the voltage of the first node N1 is at a high level and the second clock signal is at a high level, the voltage of the second node N2 remains the same. That is, the voltage of the second node N2, for example, remains at a voltage when the voltage of the first node N1 is at a high level and the second clock signal is at a low level; or, the voltage of the second node N2, for example, remains at a voltage when the voltage of the first node N1 is at a low level and the second clock signal is at a high level.

Optionally, as shown in FIGS. 6 and 7, the first control circuit 3 may include a first control sub-circuit 31 and a second control sub-circuit 32.

In some examples, as shown in FIGS. 6 and 7, the first control circuit 31 is electrically connected to the first node N1, the first voltage signal terminal VGH, the second clock signal terminal CB and a third node N3. The first control sub-circuit 31 is configured to, according to one of the first voltage signal and the second clock signal, control a voltage of the third node N3 under the control of the voltage of the first node N1 and the second clock signal.

For example, when the voltage of the first node N1 is at a high level, the third node N3 is in a floating state. At this time, the first control sub-circuit 31 may couple the second clock signal to the third node N3, and the voltage of the third node N3 may be the same as the level of the second clock signal. For example, in a case where the second clock signal is at a low level, the voltage of the third node N3 is at a low level; and in a case where the second clock signal is at a high level, the voltage of the third node N3 is at a high level.

In a case where the voltage of the first node N1 is at a low level, the first control sub-circuit 31 may receives the first voltage signal and transmits it to the third node N3 to charge the third node N3, so that the voltage of the third node N3 is at a high level. It will be noted that, in this case, the second clock signal will be coupled to the third node N3, but no matter whether the second clock signal is at a high level or a low level, the voltage of the third node N3 is determined by the first voltage signal.

For example, as shown in FIGS. 6 and 7, the second control sub-circuit 32 is electrically connected to the first node N1, the third node N3, the first voltage signal terminal, the second clock signal terminal CB and the second node N2. The second control sub-circuit 32 is configured to, according to one of the first voltage signal and the second clock signal, control the voltage of the second node N2 under control of the voltage of the first node N1 and the voltage of the third node N3.

For example, in a case where the voltage of the first node N1 is at a low level, the voltage of the third node N3 is at a high level, and the second control sub-circuit 32 may receives the first voltage signal and transmits it to the second node N2 to charge the second node N2, so that the voltage of the second node N2 is at a high level.

In a case where the voltage of the first node N1 is at a high level and the second clock signal is at a low level, the voltage of the third node N3 is at a low level, and the second control sub-circuit 32 may receives the second clock signal and transmits it to the second node N2 to charge the second node N2, so that the voltage of the second node N2 is at a low level.

In addition, in a case where the voltage of the first node N1 is at a high level and the second clock signal is at a high level, the voltage of the second node N2 remains the same. That is, the voltage of the second node N2, for example, remains at the low level when the voltage of the first node N1 is at a high level and the second clock signal is at a low level; or, the voltage of the second node N2, for example, remains at the high level when the voltage of the first node N1 is at a low level and the second clock signal is at a high level.

In some examples, as shown in FIGS. 5 to 7, the holding circuit 4 is electrically connected to the second node N2, the first voltage signal terminal VGH, and the output signal terminal Gout. The holding circuit 4 is configured to transmit the first voltage signal to the output signal terminal Gout under control of the voltage of the second node 2.

For example, in a case where the voltage of the second node N2 is at a low level, the holding circuit 4 is turned on under the control of the voltage of the second node N2, and then receives first voltage signal and transmits it to the output signal terminal Gout.

Here, during a period when the holding circuit 4 is turned on, the output signal terminal Gout may output the first voltage signal as the output signal.

As can be seen from the above, in a case where the voltage of the first node N1 is at a low level, the voltage of the second node N2 is at a high level; and in a case where the voltage of the second node N2 is at a low level, the voltage of the first node N1 is at a high level. That is to say, in a process that the output circuit 2 is turned on and transmits the second clock signal to the output signal terminal Gout, the holding circuit 4 remains in an off state, so as to avoid transmitting the first voltage signal to the output signal terminal Gout and thereby ensure the accuracy of signal transmission. In a process that the holding circuit 4 is turned on and transmits the first voltage signal to the output signal terminal Gout, the output circuit 2 remains in an off state, so as to avoid transmitting the second clock signal to the output signal terminal Gout and thereby ensure the accuracy of signal transmission.

A method of driving the input circuit 1, the output circuit 2, the first control circuit 3 and the holding circuit 4 included in the shift register 100 is schematically described below by taking the timing diagram shown in FIG. 14 as an example in conjunction with the structures shown in FIGS. 5 to 7.

Figure 14:
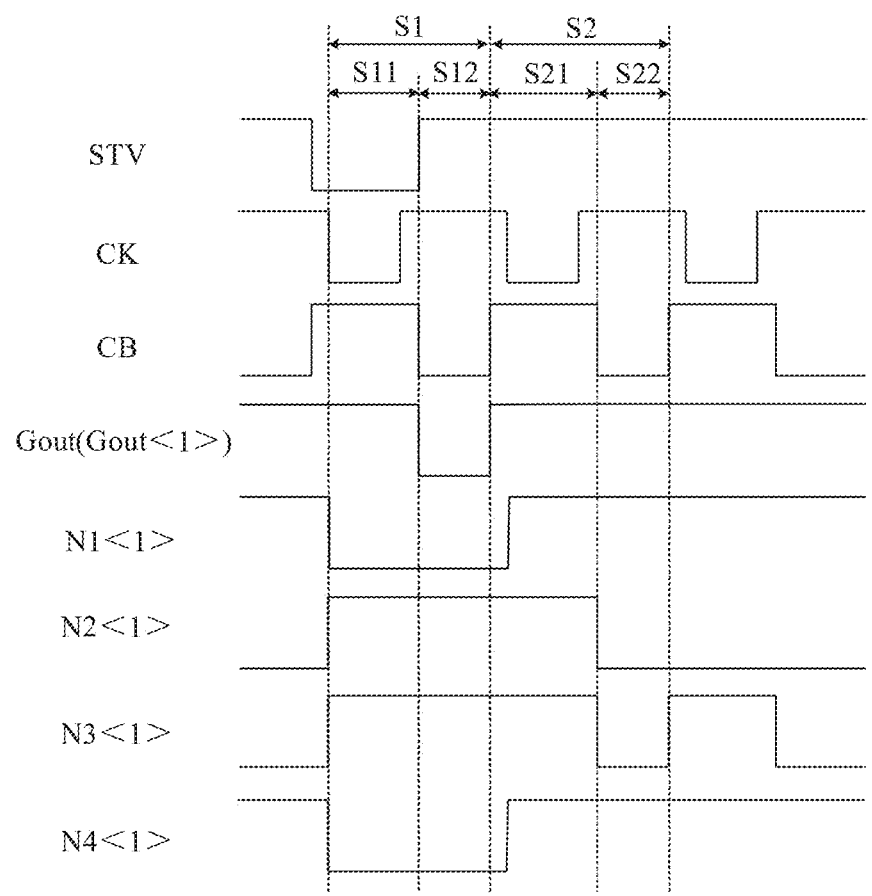
FIG. 14 is a timing diagram of the shift register shown in FIG. 13, in accordance with some embodiments of the present disclosure.

As shown in FIG. 14, a working process of the shift register 100 includes a first period S1 and a second period S2.

In the first period S1, at first, the first clock signal is at a low level, and the input signal is at a low level.

In response to the first clock signal received at the first clock signal terminal CK, the input circuit 1 is turned on and transmits the input signal received at the input signal terminal STV to the first node N1, so that the voltage of the first node N1 is at a low level.

Under the control of the voltage of the first node N1, the output circuit 2 is turned on and transmits the second clock signal received at the second clock signal terminal CB to the output signal terminal Gout. In addition, the output circuit 2 has a voltage storage function; that is, the output circuit 2 will store the low-level input signal. Even if the input circuit 1 is turned off in a period of the first period S1, this function of the output circuit 2 may keep the voltage of the first node N1 at a low level in the first period S1, and thus keep the output circuit 2 in an on state in the first period S1.

Under the control of the voltage of the first node N1 and the second clock signal, the first control circuit 3 transmits the first voltage signal transmitted by the first voltage signal terminal VGH to the second node N2, so as to control the voltage of the second node N2.

Under the control of the voltage of the second node N2, the holding circuit is turned off. In the first period S1, the voltage of the first node N1 is kept at a low level, the first control circuit 3 may continuously transmit the first voltage signal to the second node N2 without being affected by the second clock signal, so that the voltage of the second node N2 is kept at a high level, and the holding circuit 4 is kept in an off state.

In this period, the waveform of the output signal output by the output signal terminal Gout is the same as the waveform of the second clock signal. Since the second clock signal maintains at a high level first and then jumps to a low level, the output signal maintains at a high level first and then jumps to a low level. The waveform of the output signal may be as shown in FIG. 14.

In the second period S2, at first, the first clock signal is at a low level, and the input signal is at a high level.

In response to the first clock signal received at the first clock signal terminal CK, the input circuit 1 is turned on and transmits the input signal received at the input signal terminal STV to the first node N1, so that the voltage of the first node N1 is at a high level.

Under the control of the voltage of the first node N1, the output circuit 2 is turned off. The output circuit 2 has the voltage storage function. That is, the output circuit 2 will store the high-level input signal. Even if the input circuit 1 is turned off in a period of the second period S2, this function of the output circuit 2 may keep the voltage of the first node N1 at a high level in the second period S2, and thereby keep the output circuit 2 in an off state in the second period S2.

Under the control of the voltage of the first node N1 and the second clock signal, the first control circuit 3 transmits the second clock signal to the second node N2, so as to control the voltage of the second node N2.

Under the control of the voltage of the second node N2, the holding circuit 4 is turned on and transmits the first voltage signal to the output signal terminal Gout. Since in the second period S2, the voltage of the first node N1 remains at a high level, the voltage of the second node N2 will change due to influence of the second clock signal. For example, when the second clock signal jumps to a low level, the voltage of the second node N2 may change to a low level due to action of the second clock signal.

In this period, the waveform of the output signal output by the output signal terminal Gout is the same as the waveform of the first voltage signal. That is, the output signal remains at a high level. The waveform of the output signal may be as shown in FIG. 14.

It will be noted that, the low-level portion of the output signal may be referred to as a working level, which is used to turn on some transistors in a corresponding pixel driving circuit; the high-level portion of the output signal may be referred to as a non-working level, which is used to turn off some transistors in the corresponding pixel driver circuit. By electrically connecting the shift register 100 to pixel driving circuits in corresponding sub-pixels P, it may be possible to use the shift register 100 to provide the pixel driving circuits in the corresponding sub-pixels P with required operation signals, so as to drive the corresponding sub-pixels P for display.

Therefore, in the shift register 100 provided in some embodiments of the present disclosure, by providing the input circuit 1, the output circuit 2, the first control circuit 3 and the holding circuit 4 and electrically connecting the input circuit 1, the output circuit 2, the first control circuit 3 and the holding circuit 4 to corresponding signal terminals, it may be possible to turn on the output circuit 2 and the holding circuit 4 in different periods through cooperation among the signal terminals, so that the second clock signal output by the output circuit 2 and the first voltage signal output by the holding circuit 4 together constitute the output signal. The output signal may be used to drive corresponding sub-pixels P for display.

The structure of the shift register 100 provided in some embodiments of the present disclosure is relatively simple, which is conducive to improving the yield of the shift register 100 and reducing the area occupied by the shift register 100 in the display panel PNL. In the case where the shift register 100 is disposed in the border area B, the size of the border area B may be reduced, which facilitates the narrow border design.

In some embodiments, the first clock signal and the second clock signal are inverted signals.

For example, the "inverted signals" means that, in a certain time period, the level of the first clock signal and the level of the second voltage signal remain unchanged, in a case where the first clock signal is at a high level, the second clock signal is at a low level, and in a case where the first clock signal is at a low level, the second clock signal is at a high level.

There may be various ways to arrange the inverted signals, which may be selected according to actual needs, and the present disclosure does not limit this.

For example, in a certain period, when the first clock signal jumps from a high level to a low level, the second clock signal jumps from a low level to a high level, and when the first clock signal jumps from a low level to a high level, the second clock signal jumps from a high level to a low level.

For example, as shown in FIG. 14, the level of the first clock signal and the level of the second clock signal do not change at the same time.

For example, before the first clock signal jumps from a high level to a low level, the second clock signal has jumped from a low level to a high level.

It will be noted that, in the process of driving the shift register 100, considering many uncontrollable factors (such as aging of transistors or different loads), the waveform of the first clock signal and the waveform of the second clock signal may be set to the waveforms shown in FIG. 14.

The embodiments of the present disclosure are schematically described by taking an example in which the waveform of the first clock signal and the waveform of the second clock signal are as shown in FIG. 14.

By setting the first clock signal and the second clock signal to be inverted signals, it may not only be possible to make it easier to control the clock signals, but it may also be possible to reduce the number of first clock signal terminals CK and the number of second clock signal terminals CB provided. In this way, the structure of the shift register 100 may be simplified, and the structure of the scan driving circuit 1000 to which the shift register 100 is applied may be simplified, which facilitates the narrow border design.

With reference to FIG. 7, the structures of the input circuit 1, the output circuit 2, the first control circuit 3 and the holding circuit 4 are schematically described below.

In some examples, as shown in FIG. 7, the input circuit 1 includes a first transistor T1.

For example, as shown in FIG. 7, a control electrode of the first transistor T1 is electrically connected to the first clock signal terminal CK, a first electrode of the first transistor T1 is electrically connected to the input signal terminal STV, and a second electrode of the first transistor T1 is electrically connected to the first node N1.

For example, in a case where the first clock signal is at a low level, the first transistor T1 may be turned on under control of the first clock signal, and then receives the input signal and transmits it to the first node N1 to charge the first node N1. In a case where the input signal is at a low level, the voltage of the first node N1 is at a low level; and in a case where the input signal is at a high level, the voltage of the first node N1 is at a high level.

In some examples, as shown in FIG. 7, the output circuit 2 includes a second transistor T2 and a first capacitor C1.

For example, as shown in FIG. 7, a control electrode of the second transistor T2 is electrically connected to the first node N1, a first electrode of the second transistor T2 is electrically connected to the second clock signal terminal CB, and a second electrode of the second transistor T2 is electrically connected to the output signal terminal Gout.

For example, in a case where the voltage of the first node N1 is at a low level, the second transistor T2 is turned on under control of the voltage of the first node N1, and then receives the second clock signal and transmits it to the output signal terminal Gout.

For example, as shown in FIG. 7, a first end of the first capacitor C1 is electrically connected to the first node N1, and a second end of the first capacitor C1 is electrically connected to the output signal terminal Gout.

For example, in a process that the first transistor T1 is turned on and transmits the input signal to the first node N1, the first capacitor C1 may be charged. When the first transistor T1 is turned off, the first capacitor C1 may be discharged to maintain the voltage of the first node N1.

After the first transistor T1 is turned off, the first capacitor C1 may be discharged, so that the voltage of the first node N1 remains at a low level, and in turn, the second transistor T12 remains in an on state and continuously receives the second clock signal and transmits it to the output signal terminal Gout.

In some examples, as shown in FIG. 7, the first control sub-circuit 31 includes a third transistor T3 and a second capacitor C2.

For example, as shown in FIG. 7, a control electrode of the third transistor T3 is electrically connected to the first node N1, a first electrode of the third transistor T3 is electrically connected to the first voltage signal terminal VGH, and a second electrode of the third transistor T3 is electrically connected to the third node N3. A first end of the second capacitor C2 is electrically connected to the second clock signal terminal CB, and a second end of the second capacitor C2 is electrically connected to the third node N3.

For example, in a case where the voltage of the first node N1 is at a high level, the third transistor T3 may be turned off under the control of the voltage of the first node N1. At this time, the third node N3 is in a floating state. The second capacitor C2 may couple the second clock signal to the third node N3. In a case where the second clock signal is at a high level, the voltage of the third node N3 is at a high level; and in a case where the second clock signal is at a low level, the voltage of the third node N3 is at a low level.

In a case where the voltage of the first node N1 is at a low level, the third transistor T3 is turned on under the control of the voltage of the first node N1, and then receives the first voltage signal and transmits it to the third node N3 to charge the third node N3, so that the voltage of the third node N3 rises. In this case, the second clock signal will still be coupled to the third node N3 through the second capacitor C2, but no matter whether the second clock signal is at a high level or low level, the voltage of the third node N3 is controlled by the first voltage signal.

In some examples, as shown in FIG. 7, the second control sub-circuit 32 includes a fourth transistor T4 and a fifth transistor T5.

For example, as shown in FIG. 7, a control electrode of the fourth transistor T4 is electrically connected to the first node N1, a first electrode of the fourth transistor T4 is electrically connected to the first voltage signal terminal VGH, and a second electrode of the fourth transistor T4 is electrically connected to the second node N2.

For example, in a case where the voltage of the first node N1 is at a low level, the fourth transistor T4 is turned on under the control of the voltage of the first node N1, and then receives the first voltage signal and transmits it to the second node N2 to charge the second node N2, so that the voltage of the second node N2 rises.

For example, as shown in FIG. 7, a control electrode of the fifth transistor T5 is electrically connected to the third node N3, a first electrode of the fifth transistor T5 is electrically connected to the second clock signal terminal CB, and a second electrode of the fifth transistor T5 is electrically connected to the second node N2.

For example, in a case where the voltage of the third node N3 is at a low level, the fifth transistor T5 is turned on under control of the voltage of the third node N3, and then receives the second clock signal and transmits it to the second node N2 to charge the second node N2.

That is to say, in a case where the voltage of the first node N1 is at a low level, the third transistor T3 and the fourth transistor T4 are turned on under the control of the voltage of the first node N1, and the third transistor T3 receives the first voltage signal and transmit it to the third node N3, so that the fifth transistor T5 is turned off, and the fourth transistor T4 receives the first voltage signal and transmit it to the second node N2, so that the voltage of the second node N2 is at a high level.

In a case where the voltage of the first node N1 is at a high level, the third transistor T3 and the fourth transistor T4 are turned off under the control of the voltage of the first node N1. In a case where the second clock signal is at a low level, the second capacitor C2 may couple the second clock signal to the third node N3, so that the fifth transistor T5 is turned on. The fifth transistor T5 receives the second clock signal and transmits it to the second node N2, so that the second node N2 is at a low level.

In some examples, as shown in FIG. 7, the holding circuit 4 includes a sixth transistor T6 and a third capacitor C3.

For example, as shown in FIG. 7, a control electrode of the sixth transistor T6 is electrically connected to the second node N2, a first electrode of the sixth transistor T6 is electrically connected to the first voltage signal terminal VGH, and a second electrode of the sixth transistor T6 is electrically connected to the output signal terminal Gout.

For example, in the case where the voltage of the second node N2 is at a low level, the sixth transistor T6 is turned on under control of the voltage of the second node N2, and then receives the first voltage signal and transmits it to the output signal terminal Gout.

For example, as shown in FIG. 7, a first end of the third capacitor C3 is electrically connected to the second node N2, and a second end of the third capacitor C3 is electrically connected to the first voltage signal terminal VGH.

For example, in a process that the fifth transistor T5 is turned on and transmits the second clock signal to the second node N2, the third capacitor C3 may be charged. When the fifth transistor T5 is turned off, the third capacitor C3 may be discharged to maintain the voltage of the second node N2.

After the fifth transistor T5 is turned off, the third capacitor C3 may be discharged to keep the voltage of the second node N2 at a low level, and in turn, the sixth transistor T6 may remain in an on state and continuously receive the first voltage signal and transmit it to the output signal terminal Gout.

In the related art, as shown in FIG. 1, a shift register includes two D flip-flops. A first D flip-flop includes a first transmission gate TG1, a first NAND gate Nand1, a first inverter INV1 and a second transmission gate TG2. A second D flip-flop includes a third transmission gate TG3, a second NAND gate Nand2, a second inverter INV2 and a fourth transmission gate TG4. A method of driving the shift register is as follows: when a clock signal clk is at a low level and a inverted clock signal clkb is at a high level, the first D flip-flop is turned on, and a signal output by a previous shift register is transmitted to the first D flip-flop (since the third transmission gate TG3 of the second D flip-flop is in an off state, the signal cannot enter the second D flip-flop); when the clock signal clk is at a high level and the inverted clock signal clkb is at a low level, the first D flip-flop is turned off and the signal is latched, and at this time, the second D flip-flop is turned on and outputs the signal. Thus, shifting from the previous shift register to a next shift register is achieved.

Since each D flip-flop of the shift register in the related art requires two transmission gates, an inverter and a NAND gate, and each shift register requires two D flip-flops, the circuit will be very complicated and occupy a large space, making it difficult to achieve a narrow border design.

However, the shift register 100 provided in the embodiments of the present disclosure has a simple structure with six transistors and three capacitors. With this arrangement, it may be possible to improve the yield of the shift register 100 and reduce the area occupied by the shift register 100 in the display panel PNL. In the case where the shift register 100 is disposed in the border area B, the size of the border area B may be reduced, which facilitates the narrow border design.

It will be noted that, the description "electrically connected" in the present disclosure may refer to direct electrical connection or indirect electrical connection, which may be determined according to actual needs.

Figure 8:
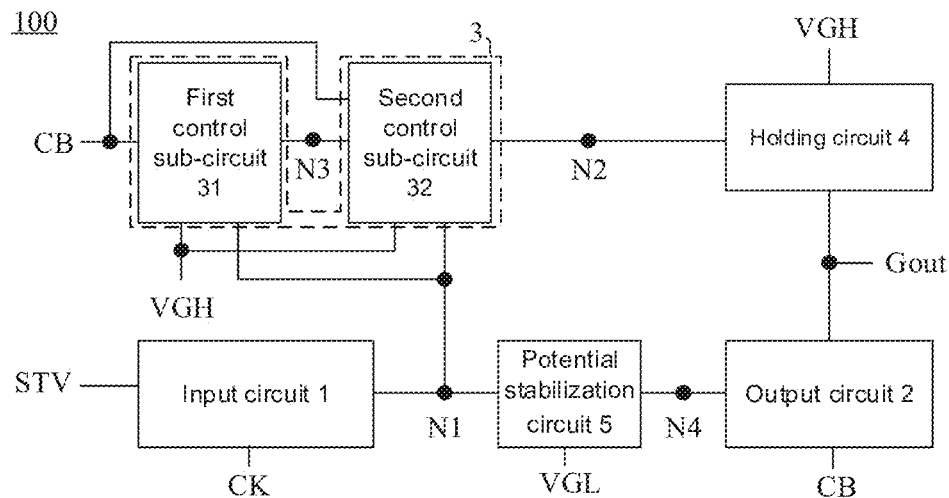
FIG. 8 is a structural diagram of yet another shift register, in accordance with some embodiments of the present disclosure.
Figure 9:
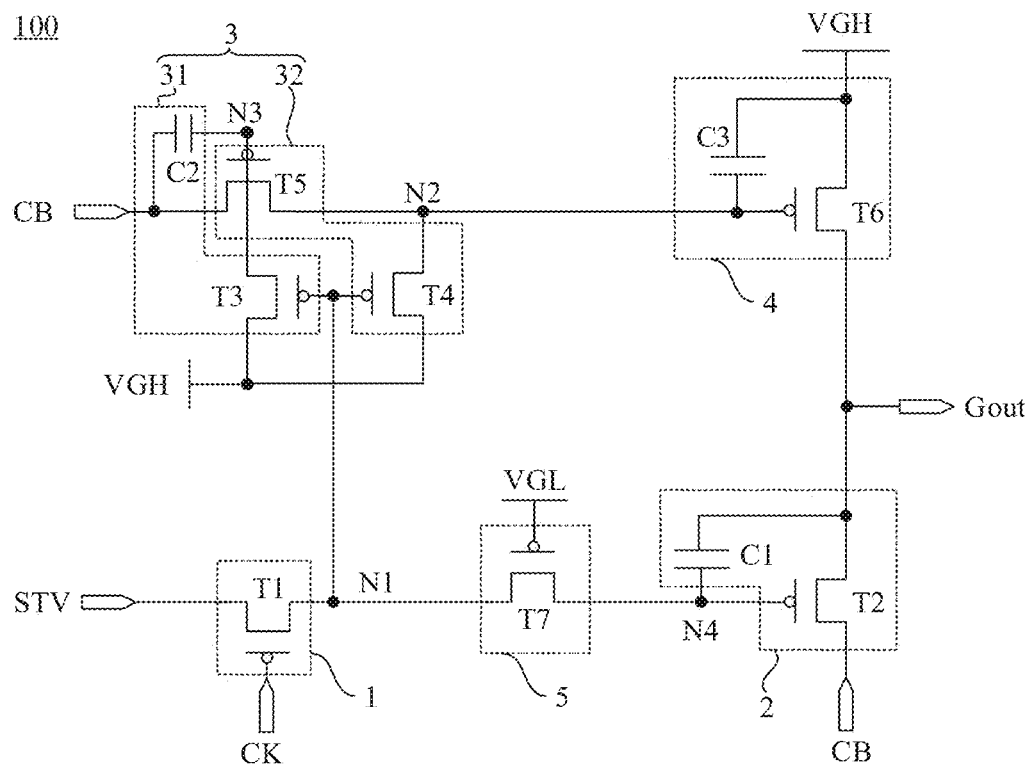
FIG. 9 is a circuit diagram of another shift register, in accordance with some embodiments of the present disclosure.

In some embodiments, as shown in FIGS. 8 and 9, the shift register 100 further includes a potential stabilization circuit 5.

In some examples, as shown in FIGS. 8 and 9, the potential stabilization circuit 5 is electrically connected to the first node N1, a second voltage signal terminal VGL and a fourth node N4. The potential stabilization circuit 5 is configured to transmit the input signal from the first node N1 to the fourth node N4 under control of a second voltage signal transmitted by the second voltage signal terminal VGL, and stabilize a voltage of the fourth node N4.

Based on this, the output circuit 2 is electrically connected to the fourth node N4, so that the output circuit 2 is electrically connected to the first node N1 through the potential stabilization circuit 5. That is, the electrical connection between the output circuit 2 and the input circuit 1 is an indirect electrical connection, which is achieved through the potential stabilization circuit 5. The output circuit 2 is configured to transmit the second clock signal received at the second clock signal terminal CB to the output signal terminal Gout under control of the voltage of the fourth node N4.

In addition, the second voltage signal terminal VGL is configured to transmit a direct-current low-level signal (e.g., lower than or equal to a low-level portion of the clock signal); here, the direct-current low-level signal is referred to as the second voltage signal. The "high level" and "low level" mentioned herein are relative terms, and a voltage value of the "high level" and a voltage value of the "low level" are not limited.

For example, the second voltage signal is at a low level, and the potential stabilization circuit 5 remains in an on state. In a case where the input circuit 1 is turned on and transmits the input signal to the first node N1, the potential stabilization circuit 5 may transmit the input signal to the fourth node N4. In a case where the input signal transmitted to the fourth node N4 is at a low level, the output circuit 2 may be turned on under the control of the voltage of the fourth node N4, and then receives the second clock signal and transmits it to the output signal terminal Gout.

When the input circuit 1 is turned off, the input circuit 1 does not output signals. At this time, the first node N1 is in a floating state.

It will be noted that, when the output circuit 2 is turned on and the second clock signal is at a low level, the voltage of the fourth node N4 is prone to be further reduced due to a bootstrap effect of the first capacitor C1. Due to action of the voltage of the fourth node N4, the potential stabilization circuit 5 may be turned off to prevent a current leakage at the fourth node N4 through the input circuit 1, thereby stabilizing the voltage of the fourth node N4 and ensuring the stable conduction state of the output circuit 2. Therefore, the accuracy of the output signal may be ensured.

In addition, since the potential stabilization circuit 5 is turned off, it may also be possible to prevent the voltage of the first node N1 from being greatly reduced due to the change in the voltage of the fourth node N4, and thereby prevent the working performance of the input circuit 1 (e.g., the first transistor T1) and the third control circuit 7 (e.g., the ninth transistor T9) from being affected by a significant decrease in the voltage of the first node N1. Here, as for the third control circuit 7 (e.g., the ninth transistor T9), reference may be made to the following description, and details will not be provided here.

The structure of the potential stabilization circuit 5 is schematically described below with reference to FIG. 9.

In some examples, as shown in FIG. 9, the potential stabilization circuit 5 includes a seventh transistor T7.

For example, as shown in FIG. 9, a control electrode of the seventh transistor T7 is electrically connected to the second voltage signal terminal VGL, a first electrode of the seventh transistor T7 is electrically connected to the first node N1, and a second electrode of the seventh transistor T7 is electrically connected to the fourth node N4.

In addition, since the control electrode of the seventh transistor T7 is electrically connected to the second voltage signal terminal VGL, and the second voltage signal is a direct current low-level signal, the seventh transistor T7 is always in an on state, and transmits the input signal from the first node N1 to the fourth node N4.

For example, as shown in FIG. 9, in the case where the output circuit 2 includes a second transistor T2, the control electrode of the second transistor T2 is electrically connected to the fourth node N4, so that the control electrode of the second transistor T2 is electrically connected to the first node N1 through the seventh transistor T7. That is, the electrical connection between the control electrode of the second transistor T2 and the first node N1 is an indirect electrical connection.

By providing the seventh transistor T7, it may be possible to prevent a current leakage at the fourth node N4 through the first transistor T1, so that the voltage of the fourth node N4 is more stable, and the second transistor T2 is in a more stable on state. Moreover, it may also be possible to make the voltage of the first node N1 more controllable and stable, and thus prevent the working performance of the first transistor T1 and the ninth transistor T9 from being affected by a significant change in the voltage of the first node N1.

Figure 10:
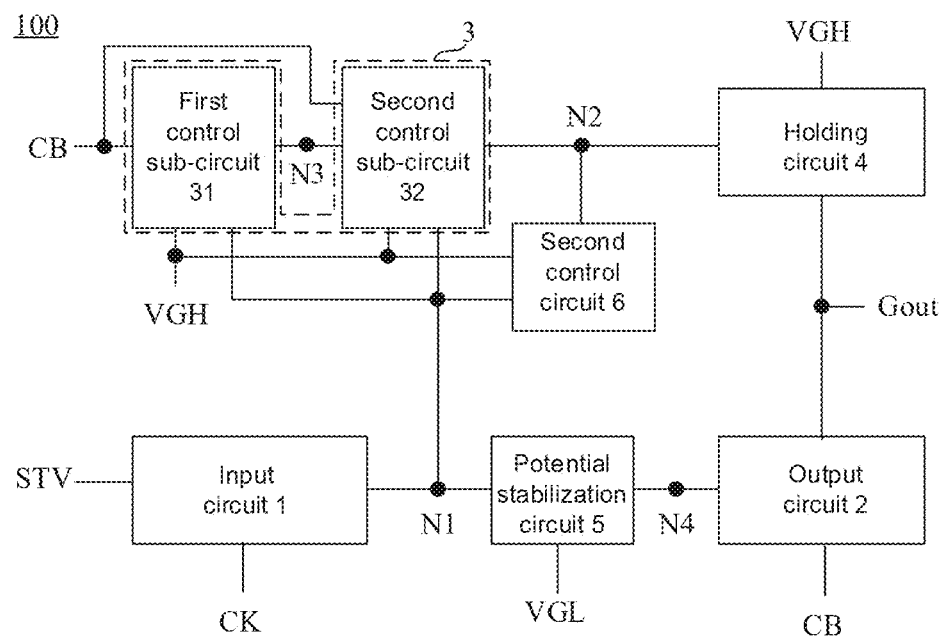
FIG. 10 is a structural diagram of yet another shift register, in accordance with some embodiments of the present disclosure.
Figure 11:
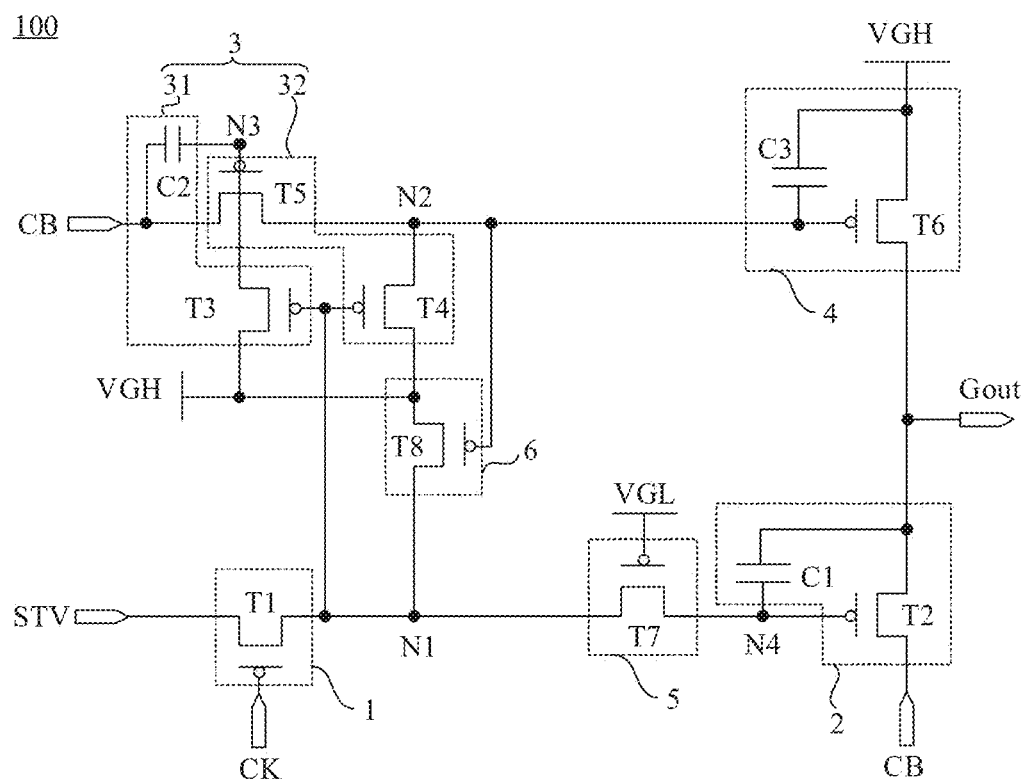
FIG. 11 is a circuit diagram of yet another shift register, in accordance with some embodiments of the present disclosure.

In some embodiments, as shown in FIGS. 10 and 11, the shift register 100 further includes a second control circuit 6.

In some examples, as shown in FIGS. 10 and 11, the second control circuit 6 is electrically connected to the second node N2, the first voltage signal terminal VGH and the first node N1. The second control circuit 6 is configured to transmit the first voltage signal to the first node N1 under the control of the voltage of the second node N2.

For example, in a case where the voltage of the second node N2 is at a low level, the second control circuit 6 is turned on under the control of the voltage of the second node N2, and then receives the first voltage signal and transmits it to the first node N1 to charge the first node N1, so that the voltage of the first node N1 is at a high level.

By providing the second control circuit 6, when the voltage of the second node N2 is at a low level, it may be possible to make the voltage of the first node N1 a high level, so that the third node N3 is in a floating state, and the voltage of the third node N3 is controlled by the low-level second clock signal. In this way, it may be possible to prevent the first control sub-circuit 31 from erroneously transmitting the high-level first voltage signal to the third node N3 and prevent the second control sub-circuit 32 from erroneously transmitting the high-level first voltage signal to the second node N2, which may help ensure that the voltage of the second node N2 remains at a low level and that the holding circuit 4 is in a stable on state. As a result, it may be possible to ensure stable transmission of the high-level first voltage signal by the holding circuit 4, and ensure stable output of the high-level output signal by the output signal terminal Gout.

The structure of the second control circuit 6 is schematically described below with reference to FIG. 11.

In some examples, as shown in FIG. 11, the second control circuit 6 includes an eighth transistor T8.

For example, as shown in FIG. 11, a control electrode of the eighth transistor T8 is electrically connected to the second node N2, a first electrode of the eighth transistor T8 is electrically connected to the first voltage signal terminal VGH, and a second electrode of the eighth transistor T8 is electrically connected to the first node N1.

For example, in a case where the voltage of the second node N2 is at a low level, the eighth transistor T8 is turned on under the control of the voltage of the second node N2, and then receives the first voltage signal and transmits it to the first node N1 to charge the first node N1, so that the voltage of the first node N1 is at a high level.

By providing the eighth transistor T8, when the voltage of the second node N2 is at a low level, it may be possible to make the voltage of the first node N1 at a high level, so that the third transistor T3 and the fourth transistor T4 remains in an off state. In this way, it may be possible to prevent the fifth transistor T5 from being turned off and failing to transmit the low-level second clock signal to the second node N2 due to an erroneous turning-on of the third transistor T3, and prevent the fourth transistor T4 from being erroneously turned on and transmitting the high-level first voltage signal to the second node N2. Therefore, it may help ensure that the voltage of the second node N2 remains at a low level and that the sixth transistor T6 is in a stable on state. As a result, it may be possible to ensure stable transmission of the high-level first voltage signal by the sixth transistor T6, and stable output of the high-level output signal by the output signal terminal Gout.

Figure 12:
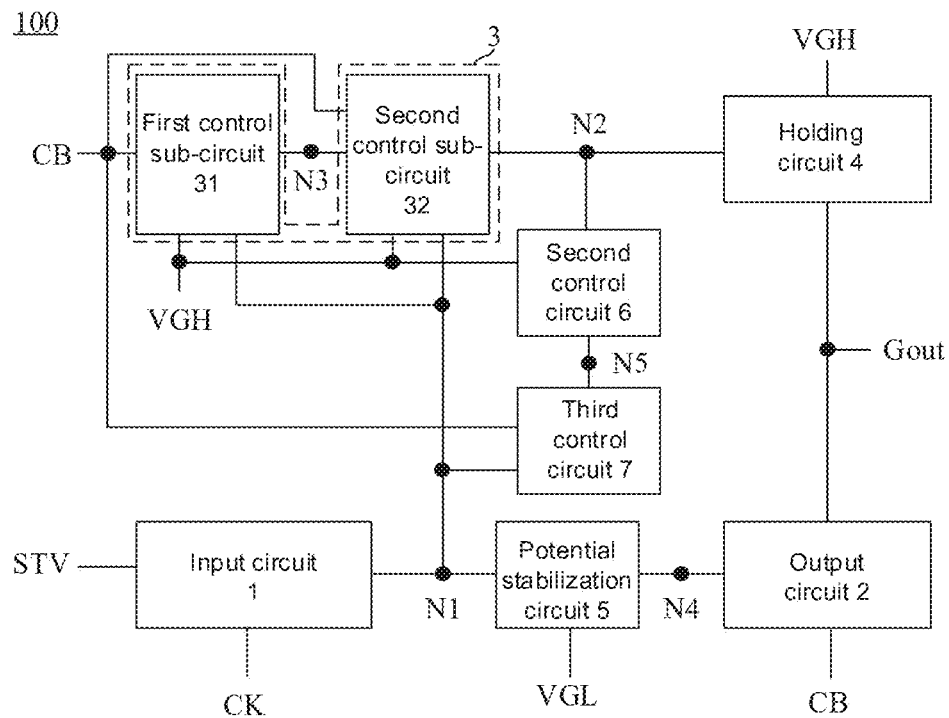
FIG. 12 is a structural diagram of yet another shift register, in accordance with some embodiments of the present disclosure.
Figure 13:
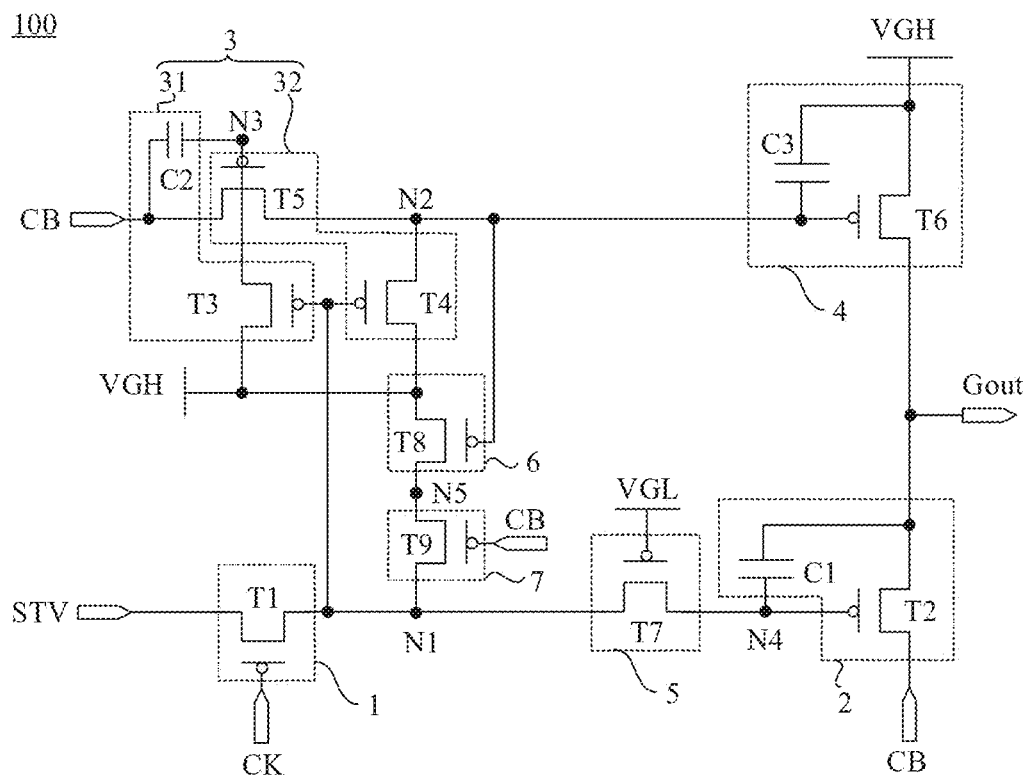
FIG. 13 is a circuit diagram of yet another shift register, in accordance with some embodiments of the present disclosure.

In some embodiments, as shown in FIGS. 12 and 13, the shift register 100 further includes a third control circuit 7.

In some examples, as shown in FIGS. 12 and 13, the first control circuit 7 is electrically connected to the second clock signal terminal CB, a fifth node N5 and the first node N1. The second control circuit 6 is electrically connected to the fifth node N5, so that the second control circuit 6 is electrically connected to the first node N1 through the third control circuit 7. That is, the electrical connection between the second control circuit 6 and the first node N1 is an indirect electrical connection, which is realized through the third control circuit 7.

Based on this, the second control circuit 6 is configured to transmit the first voltage signal to the fifth node N5 under the control of the voltage of the second node N2. The third control circuit 7 is configured to transmit the first voltage signal from the fifth node N5 to the first node N1 under the control of the second clock signal.

For example, in a case where the voltage of the second node N2 is at a low level, the second control circuit 6 is turned on under the control of the voltage of the second node N2, and then receives the first voltage signal and transmits it to the fifth node N5. In a case where the second clock signal is at a low level, the third control circuit 7 is turned on under the control of the second clock signal, and transmits the first voltage signal from the fifth node N5 to the first node N1 to charge the first node N1, so that the voltage of the first node N1 is at a high level.

That is to say, when the voltage of the second node N2 is at a low level and the second clock signal is at a low level, the first voltage signal may be transmitted to the first node N1 through the second control circuit 6 and the third control circuit 7 in sequence to control the voltage of the first node N1 without affecting the voltage of the second node N2.

In addition, at the beginning of the first period S1, the voltage of the second node N2 jumps from a low level to a high level, and the first clock signal and the input signal both jump to a low level. The input circuit 1 transmits the input signal to the first node N1, so that the voltage of the first node N1 jumps from a high level to a low level. In this process, the voltage of the first node N1 may be unstable.

By providing the third control circuit 7 between the second control circuit 6 and the first node N1, it may be possible to ensure that the third control circuit 7 is in an off state at the beginning of the first period S1. Therefore, in the process that the input circuit 1 transmits the input signal to the first node N1, it may be possible to prevent the voltage of the first node N1 from being affected by the first voltage signal, and ensure that the voltage of the first node N1 is controlled by the input signal. In this way, the reliability of the shift register 100 as a whole may be improved.

The structure of the third control circuit 7 is schematically described below with reference to FIG. 13.

In some examples, as shown in FIG. 13, the third control circuit 7 includes a ninth transistor T9.

For example, as shown in FIG. 13, a control electrode of the ninth transistor T9 is electrically connected to the second clock signal terminal CB, a first electrode of the ninth transistor T9 is electrically connected to the fifth node N5, and a second electrode of the ninth transistor T9 is electrically connected to the first node N1. In the case where the second control circuit 6 includes the eighth transistor T8, the second electrode of the eighth transistor T8 is electrically connected to the fifth node N5, so that the second electrode of the eighth transistor T8 is electrically connected to the first node N1 through the ninth transistor T9. That is, the electrical connection between the second electrode of the eighth transistor T8 and the first node N1 is an indirect electrical connection.

For example, in a case where the voltage of the second node N2 is at a low level, the eighth transistor T8 is turned on under the control of the voltage of the second node N2, and receives the first voltage signal and transmits it to the fifth node N5. In a case where the second clock signal is at a low level, the ninth transistor T9 is turned on under the control of the second clock signal, and transmits the first voltage signal from the fifth node N5 to the first node N1 to charge the first node N1, so that the voltage of the first node N1 is at a high level. In a case where the first clock signal is at a low level, the second clock signal is at a high level, and the ninth transistor T9 is turned off under the control of the second clock signal, which prevents the first voltage signal from the fifth node N5 from being transmitted to the first node N1.

It will be noted that, before the first period S1 begins, the voltage of the second node N2 is at a low level, and the first voltage signal may be transmitted to the first node N1 through the eighth transistor T8, so that the voltage of the first node N1 is at a high level. At the beginning of the first period S1, the first transistor T1 is turned on under the control of the low-level first clock signal, and transmits the low-level input signal to the first node N1. At this time, it is difficult to determine the voltage of the first node N1, and it is also difficult to determine whether the third transistor T3 and the fourth transistor T4 are turned on or off.

By providing the ninth transistor T9 between the eighth transistor T8 and the first node N1, when the first transistor T1 is turned on, it may be possible to ensure that the ninth transistor T9 is turned off and prevent the first voltage signal from being transmitted to the first node N1. Therefore, it may be possible to ensure that the voltage of the first node N1 is controlled by the low-level input signal at the beginning of the first period S1, and ensure that the third transistor T3 and the fourth transistor T4 are turned on. In this way, the reliability of the shift register 100 as a whole may be improved.

The shift register 100 provided in the embodiments of the present disclosure includes nine transistors and three capacitors, which may achieve the output of the output signal. Moreover, in the first period S1, after the output signal terminal Gout outputs a low-level second clock signal, the first control circuit 3, the second control circuit 6 and the third control circuit 7 may be used to reset the first node N1 and the fourth node N4; in the second period S2, the control electrode of the transistor may be coupled with the capacitor to control the voltage of the second node N2, so that the holding circuit 4 outputs a high-level first voltage signal stably, and the accuracy of the output signal may be improved.

The shift register 100 has a simple structure, which is conducive to improving the yield of the shift register 100 and reduce the area occupied by the shift register 100 in the display panel PNL. In the case where the shift register 100 is disposed in the border area B, the size of the border area B may be reduced, which facilitates the narrow border design.

In the scan driving circuit 1000 provided in the embodiments of the present disclosure, the cascading relationship between the plurality of shift registers 100 may vary, which may be set according to actual needs.

In some embodiments, in the plurality of shift registers 100, except for last i shift registers 100, an output signal terminal Gout of an Nth shift register 100 is electrically connected to an input signal terminal STV of an (N+i)th shift register 100. Here, N and i are both positive integers, and i is less than N (i.e., i<N).

That is, an output signal output by the Nth shift register 100 may serve as an input signal of the (N+i)th shift register 100.

In some examples, as shown in FIG. 15, i is equal to 1 (i.e., i=1). In this case, except for the last shift register 100, an output signal terminal Gout of each shift register 100 is electrically connected to an input signal terminal STV of a next shift register 100. That is, except for the last shift register 100, the output signal of each shift register may serve as the input signal of the next shift register 100.

In some examples, i is equal to 2 (i.e., i=2). In this case, except for the last two shift registers 100, the output signal terminal Gout of the Nth shift register 100 is electrically connected to an input signal terminal STV of the (N+2)th shift register 100. That is, the plurality of shift registers 100 may be divided into two groups of shift registers. One group of shift registers include odd-numbered shift registers, and an output signal terminal Gout of each odd-numbered shift register is electrically connected to an input signal terminal STV of a next odd-numbered shift registers 100; the other group of shift registers include even-numbered shift registers, and an output signal terminal Gout of each even-numbered shift register is electrically connected to an input signal terminal STV of a next even-numbered shift register 100.

In some embodiments, as shown in FIG. 15, the scan driving circuit 1000 further includes at least one first clock signal line 201 and at least one second clock signal line 202.

In some examples, the scan driving circuit 1000 includes a single first clock signal line 201 and a single second clock signal line 202.

In some other examples, the scan driving circuit 1000 includes a plurality of first clock signal lines 201 and a plurality of second clock signal lines 202.

Here, the number of first clock signal lines 201 and the number of second clock signal lines 202 included in the scan driving circuit 1000 may be determined according to the cascading relationship between the plurality of shift registers 100.

In some examples, as shown in FIG. 15, in the case where i is equal to 1 (i.e., i=1), the scan driving circuit 1000 includes a single first clock signal line 201 and a single second clock signal line 202.

Based on this, as shown in FIG. 15, the first clock signal line 201 may be electrically connected to a first clock signal terminal CK of a (2N−1)th shift register 100 and a second clock signal terminal CB of a (2N)th shift register 100; and the second clock signal line 202 may be electrically connected to a second clock signal terminal CB of the (2N−1)th shift register 100 and a first clock signal terminal CK of the (2N)th shift register 100.

The (2N−1)th shift register 100 may use a clock signal transmitted by the first clock signal line 201 as the first clock signal, and may use a clock signal transmitted by the second clock signal line 202 as the second clock signal. The (2N)th shift register 100 may use the clock signal transmitted by the second clock signal line 202 as the first clock signal, and may use the clock signal transmitted by the first clock signal line 201 as the second clock signal.

In some examples, as shown in FIG. 15, the scan driving circuit 1000 further includes an initial signal line 203.

Here, in the case where i is equal to 1 (i.e., i=1), an input signal terminal of a first shift register 100 in the scan driving circuit 1000 may be electrically connected to the initial signal line 203, so as to use an initial signal transmitted by the initial signal line 203 as the input signal.

In some examples, as shown in FIG. 15, the scan driving circuit 1000 further includes a first voltage signal line 204 and a second voltage signal line 205.

A first voltage signal terminal VGH of each shift register 100 may be electrically connected to the first voltage signal line 204 to receive the first voltage signal. A second voltage signal terminal VGL of each shift register 100 may be electrically connected to the second voltage signal line 205 to receive the second voltage signal.

A method of driving the shift register 100 shown in FIG. 13 is schematically described below with reference to FIGS. 14 and 15.

The signs A1, A2, A3, A4, . . . , A(N−1) and AN shown in FIG. 15 represent a first shift register 100, a second shift register 100, a third shift register 100, a fourth shift register 100, . . . , an (N−1)th shift register 100 and an Nth shift register 100, respectively.

FIG. 14 is a diagram showing an operation timing of the shift register 100 shown in FIG. 13. In FIG. 14, the signs N1<1>, N2<1>, N3<1> and N4<1> represent the first node N1, the second node N2, the third node N3 and the fourth node N4 of the first shift register 100, respectively, and the sign Gout<1> represents the output signal terminal Gout of the first shift register 100.

For example, a method of driving the first shift register 100 (e.g., the shift register corresponding to the first row of sub-pixels P in the display panel PNL) is described as follows. The method includes a first period S1 and a second period S2. The first period S1 includes an input period S11 and a scanning period S12, and the second period S2 includes a first holding period S21 and a second holding period S22.

In the input period S11, the input signal is at a low level, the first clock signal is at a low level, and the second clock signal is at a high level.

In response to the first clock signal, the first transistor T1 in the input circuit 1 is turned on, and transmits the input signal to the first node N1<1> to charge the first node N1<1>, so that the voltage of the first node N1<1> voltage is at a low level.

Under the control of the voltage of the first node N1<1> and the second clock signal, the first control circuit 3 transmits the first voltage signal to the second node N2<1>, so as to control the voltage of the second node N2<1>. For example, under control of the voltage of the first node N1<1>, the third transistor T3 and the fourth transistor T4 in the first control circuit 3 are turned on. The third transistor T3 transmits the first voltage signal to the third node N3<1> to charge the third node N3<1>, so that the voltage of the third node N3<1> is at a high level, and the fifth transistor T5 is turned off. The fourth transistor T4 transmits the first voltage signal to the second node N2<1> to charge the second node N2<1>, so that the voltage of the second node N2<1> is at a high level.

Under the control of the voltage of the second node N2<1>, the sixth transistor T6 in the hold circuit 4 is turned off. At the same time, the first voltage signal charges the third capacitor C3.

Under the control of the voltage of the second node N2<1>, the eighth transistor T8 in the second circuit 6 is turned off.

Under control of the second clock signal, the ninth transistor T9 in the third circuit 7 is turned off.

Under control of the second voltage signal, the seventh transistor T7 in the potential stabilization circuit 5 is kept in an on state, and transmits the input signal at the first node N1<1> to the fourth node N4<1>, so that the voltage of the fourth node N4<1> is at a low level. At the same time, the first capacitor C1 is charged.

Under the control of the voltage of the first node N1<1> (i.e., under the control of the voltage of the fourth node N4<1>), the second transistor T2 in the output circuit 2 is turned on and transmits the second clock signal to the output signal terminal Gout<1>. The signal is then output from the output signal terminal Gout<1> as an output signal. In this period, the second clock signal is at a high level; therefore, the output signal is at a high level.

In the scanning period S12, the input signal is at a high level, the first clock signal is at a high level, and the second clock signal is at a low level.

In response to the first clock signal, the first transistor T1 in the input circuit 1 is turned off. The first node N1<1> has no discharge path; therefore, the voltage of the first node N1<1> remains substantially unchanged (that is, the voltage of the first node N1<1> remains at a low level).

Under the control of the voltage of the first node N1<1> and the second clock signal, the first control circuit 3 transmits the first voltage signal to the second node N2<1>, so as to control the voltage of the second node N2<1>. For example, under the control of the voltage of the first node N1<1>, the third transistor T3 and the fourth transistor T4 in the first control circuit 3 are kept in an on state. The voltage of the third node N3<1> is still at a high level, and the fifth transistor T5 remains in an off state. The voltage of the second node N2<1> is still at a high level. Under the control of the voltage of the second node N2<1>, the sixth transistor T6 in the holding circuit 4 remains in an off state. At the same time, the third capacitor C3 continues to be charged.

Under the control of the voltage of the second node N2<1>, the eighth transistor T8 in the second control circuit 6 remains in an off state.

Under the control of the second clock signal, the ninth transistor T9 in the third control circuit 7 is turned on.

The first capacitor C1 is discharged, so that the voltage of the fourth node N4<1> remains at a low level. Under the control of the voltage of the first node N1<1> (i.e., under the control of the voltage of the fourth node N4<1>), the second transistor T2 in the output circuit 2 remains in an on state, and continuously transmits the second clock signal to the output signal terminal Gout<1>. In this period, the second clock signal is at a low level; therefore, the output signal is at a low level.

In the first holding period S21, the input signal is at a high level; the first clock signal remains at a high level first, and then jumps to a low level; and the second clock signal is at a high level.

Before the first clock signal jumps to a low level, the voltage of the first node N1<1> and the voltage of the fourth node N4<1> remain at a low level. Based on this, the voltage of the second node N2<1> and the voltage of the third node N3<1> remain at a high level. The second transistor T2 in the output circuit 2 remains in an on state, and continuously transmits the second clock signal to the output signal terminal Gout<1>. The second clock signal is at a high level; therefore, the output signal is at a high level.

After the first clock signal jumps to a low level, in response to the first clock signal, the first transistor T1 in the input circuit 1 is turned on, and transmits the input signal to the first node N1<1> to charge the first node N1<1>, so that the voltage of the first node N1<1> voltage is at a high level.

Under the control of the second voltage signal, the seventh transistor T7 in the potential stabilization circuit 5 remains in an on state, and transmits the input signal at the first node N1<1> to the fourth node N4<1>, so that the voltage of the fourth node N4<1> is at a high level. In this way, the reset of the first node N1<1> and the fourth node N4<1> is completed. At the same time, the first capacitor C1 is charged.

Under the control of the voltage of the first node N1<1> (i.e., under the control of the voltage of the fourth node N4<1>), the second transistor T2 in the output circuit 2 is turned off.

Under the control of the voltage of the first node N1<1> and the second clock signal, the first control circuit 3 transmits the second clock signal to the second node N2<1>, so as to control the voltage of the second node N2<1>. For example, under the control of the voltage of the first node N1<1>, the third transistor T3 and the fourth transistor T4 in the first control circuit 3 are turned off. The third node N3<1> is in a floating state. Since the second clock signal is at a high level, the voltage of the third node N3<1> may jump to a high level due to the coupling effect of the second capacitor C2; therefore, the fifth transistor T5 may be kept in an off state. The third capacitor C3 is discharged, so that the voltage of the second node N2<1> remains at a high level. Under the control of the voltage of the second node N2<1>, the sixth transistor T6 in the holding circuit 4 remains in an off state.

Under the control of the voltage of the second node N2<1>, the eighth transistor T8 in the second control circuit 6 remains in an off state.

Since the output signal terminal Gout<1> of the shift register 100 is connected to a load (i.e., a pixel driving circuit in a sub-pixel P), the output signal output by the output signal terminal Gout<1> is at a same level as the first clock signal before it jumps. That is, the output signal output by the output signal terminal Gout<1> is still at a high level.

In the second holding period S22, the input signal is at a high level, the first clock signal is at a high level, and the second clock signal is at a low level.

In response to the first clock signal, the first transistor T1 in the input circuit 1 is turned off. The voltage of the first node N1<1> and the voltage of the fourth node N4<1> remain substantially unchanged (that is, the voltage of the first node N1<1> and the voltage of the fourth node N4<1> remain at a high level). Under the control of the voltage of the first node N1<1> (i.e., under the control of the voltage of the fourth node N4<1>), the second transistor T2 in the output circuit 2 remains in an off state.

Under the control of the voltage of the first node N1<1> and the second clock signal, the first control circuit 3 transmits the second clock signal to the second node N2<1>, so as to control the voltage of the second node N2<1>. For example, under the control of the voltage of the first node N1<1>, the third transistor T3 and the fourth transistor T4 in the first control circuit 3 remain in an off state, so that the third node N3<1> remains in a floating state. Since the second clock signal is at a low level, the voltage of the third node N3<1> may jump to a low level due to the coupling effect of the second capacitor C2; therefore, the fifth transistor T5 is turned on. The fifth transistor T5 transmits the second clock signal to the second node N2<1> to charge the second node N2<1>, so that the voltage of the second node N2<1> is at a low level.

Under the control of the voltage of the second node N2<1>, the eighth transistor T8 in the second control circuit 6 is turned on and transmits the first voltage signal to the fifth node N5.

Under the control of the second clock signal, the ninth transistor T9 in the third control circuit 7 is turned on and transmits the first voltage signal from the fifth node N5 to the first node N1<1> to charge the first node N1<1>, so that the voltage of the first node N1<1> is at a high level.

Under the control of the voltage of the second node N2<1>, the sixth transistor T6 in the holding circuit 4 is turned on and transmits the first voltage signal to the output signal terminal Gout<1>. The output signal output by the output signal terminal Gout<1> is at a high level.

It will be noted that, the method of driving the shift register 100 may include a plurality of S21 periods and a plurality of S22 periods, which are performed in sequence in cycles. During this process, the eighth transistor T8 in the second control circuit 6 and the ninth transistor T9 in the third control circuit 7 remain in an on state, and the sixth transistor T6 in the holding circuit 4 remains in an on state, and continuously transmits the first voltage signal to the output signal terminal Gout<1>, so that the output signal terminal Gout<1> continuously outputs a high-level output signal. Every time the second clock signal jumps from a high level to a low level, the level of the control electrode of the fifth transistor T5 will be coupled and pulled down once, which causes the fifth transistor T5 to be turned on and transmits the second clock signal to the second node N2<1>; and at the same time, the third capacitor C3 is charged, so that the voltage of the second node N2<1> is kept at a low level. After the input signal jumps to a low level, this process will end.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register, comprising:
   an input circuit electrically connected to a first clock signal terminal, an input signal terminal and a first node, the input circuit being configured to transmit an input signal received at the input signal terminal to the first node under control of a first clock signal transmitted by the first clock signal terminal;
   an output circuit electrically connected to the first node, a second clock signal terminal and an output signal terminal, the output circuit being configured to transmit a second clock signal received at the second clock signal terminal to the output signal terminal under control of a voltage of the first node; wherein the output circuit includes a second transistor and a first capacitor;
   a first control circuit electrically connected to the first node, a first voltage signal terminal, the second clock signal terminal and a second node, the first control circuit being configured to, according to one of a first voltage signal transmitted by the first voltage signal terminal and the second clock signal received at the second clock signal terminal, control a voltage of the second node under control of the voltage of the first node and the second clock signal; and
   a holding circuit electrically connected to the second node, the first voltage signal terminal and the output signal terminal, the holding circuit being configured to transmit the first voltage signal to the output signal terminal under control of the voltage of the second node;
   wherein the input circuit includes a first transistor;
   a control electrode of the first transistor is electrically connected to the first clock signal terminal, a first electrode of the first transistor is electrically connected to the input signal terminal, and a second electrode of the first transistor is directly electrically connected to the first node;
   wherein the first control circuit includes a third transistor and a second capacitor; a control electrode of the third transistor is electrically connected to the first node, a first electrode of the third transistor is electrically connected to the first voltage signal terminal, and a second electrode of the third transistor is electrically connected to a third node; and a first end of the second capacitor is electrically connected to the second clock signal terminal, and a second end of the second capacitor is electrically connected to the third node; and
   the shift register further comprises a potential stabilization circuit including a seventh transistor; the control electrode of the second transistor is electrically connected to the seventh transistor, the first electrode of the second transistor is electrically connected to the second clock signal terminal, and the second electrode of the second transistor is electrically connected to the output signal terminal; and the first end of the first capacitor is electrically connected to the control electrode of the second transistor, and the second end of the first capacitor is electrically connected to the output signal terminal;
   wherein the first control circuit includes a first control sub-circuit and a second control sub-circuit;
   the first control sub-circuit includes the third transistor and the second capacitor; the first control sub-circuit is configured to, according to one of the first voltage signal and the second clock signal, control a voltage of the third node under the control of the voltage of the first node and the second clock signal;

the second control sub-circuit is electrically connected to the first node, the third node, the first voltage signal terminal, the second clock signal terminal and the second node; the second control sub-circuit is configured to, according to one of the first voltage signal and the second clock signal, control the voltage of the second node under control of the voltage of the first node and the voltage of the third node.

2. The shift register according to claim 1, wherein the second control sub-circuit includes a fourth transistor and a fifth transistor;

a control electrode of the fourth transistor is electrically connected to the first node, a first electrode of the fourth transistor is electrically connected to the first voltage signal terminal, and a second electrode of the fourth transistor is electrically connected to the second node; and a control electrode of the fifth transistor is electrically connected to the third node, a first electrode of the fifth transistor is electrically connected to the second clock signal terminal, and a second electrode of the fifth transistor is electrically connected to the second node.

3. The shift register according to claim 1, wherein the potential stabilization circuit is electrically connected to the first node, a second voltage signal terminal and a fourth node; the potential stabilization circuit is configured to transmit the input signal from the first node to the fourth node under control of a second voltage signal transmitted by the second voltage signal terminal, and stabilize a voltage of the fourth node;

wherein the output circuit is electrically connected to the fourth node, so that the output circuit is electrically connected to the first node through the potential stabilization circuit.

4. The shift register according to claim 3, wherein a control electrode of the seventh transistor is electrically connected to the second voltage signal terminal, a first electrode of the seventh transistor is electrically connected to the first node, and a second electrode of the seventh transistor is electrically connected to the fourth node.

5. The shift register according to claim 1, further comprising a second control circuit, wherein the second control circuit is electrically connected to the second node, the first voltage signal terminal and the first node, and the second control circuit is configured to transmit the first voltage signal to the first node under the control of the voltage of the second node.

6. The shift register according to claim 5, wherein the second control circuit includes an eighth transistor;

a control electrode of the eighth transistor is electrically connected to the second node, a first electrode of the eighth transistor is electrically connected to the first voltage signal terminal, and a second electrode of the eighth transistor is electrically connected to the first node.

7. The shift register according to claim 5, further comprising a third control circuit, wherein the third control circuit is electrically connected to the second clock signal terminal, a fifth node and the first node; the second control circuit is electrically connected to the fifth node, so that the second control circuit is electrically connected to the first node through the third control circuit;

the second control circuit is configured to transmit the first voltage signal to the fifth node under the control of the voltage of the second node; and the third control circuit is configured to transmit the first voltage signal from the fifth node to the first node under control of the second clock signal.

8. The shift register according to claim 7, wherein the third control circuit includes a ninth transistor;

a control electrode of the ninth transistor is electrically connected to the second clock signal terminal, a first electrode of the ninth transistor is electrically connected to the fifth node, and a second electrode of the ninth transistor is electrically connected to the first node;

the second control circuit includes an eighth transistor, a control electrode of the eighth transistor is electrically connected to the second node, a first electrode of the eighth transistor is electrically connected to the first voltage signal terminal, and a second electrode of the eighth transistor is electrically connected to the fifth node.

9. The shift register according to claim 1, wherein the holding circuit includes a sixth transistor and a third capacitor;

a control electrode of the sixth transistor is electrically connected to the second node, a first electrode of the sixth transistor is electrically connected to the first voltage signal terminal, and a second electrode of the sixth transistor is electrically connected to the output signal terminal; and a first end of the third capacitor is electrically connected to the second node, and a second end of the third capacitor is electrically connected to the first voltage signal terminal.

10. A method of driving the shift register according to claim 1, the method comprising a first period and a second period, wherein in the first period, under the control of the voltage of the first node and the second clock signal, the first control circuit transmits the first voltage signal transmitted by the first voltage signal terminal to the second node, so as to control the voltage of the second node;

under the control of the voltage of the second node, the holding circuit is turned off;

in response to a level of the first clock signal received at the first clock signal terminal, the input circuit is turned on and transmits a level of an input signal received at the input signal terminal to the first node; and under the control of the voltage of the first node, the output circuit is turned on and transmits the second clock signal received at the second clock signal terminal to the output signal terminal;

in the second period, under the control of the voltage of the first node and the second clock signal, the first control circuit transmits the second clock signal to the second node, so as to control the voltage of the second node;

under the control of the voltage of the second node, the holding circuit is turned on and transmits the first voltage signal to the output signal terminal;

in response to the level of the first clock signal received at the first clock signal terminal, the input circuit is turned on and transmits another level of the input signal received at the input signal terminal to the first node; and under the control of the voltage of the first node, the output circuit is turned off.

11. The method of driving the shift register according to claim 10, wherein the first period includes an input period and a scanning period;
- in the input period, in response to the level of the first clock signal, the input circuit is turned on and transmits the level of the input signal to the first node;
- under the control of the voltage of the first node, the output circuit is turned on and transmits a level of the second clock signal to the output signal terminal;
- under the control of the voltage of the first node and the level of the second clock signal, the first control circuit transmits the first voltage signal to the second node, so as to control the voltage of the second node; and
- under the control of the voltage of the second node, the holding circuit is turned off;
- in the scanning period, in response to another level of the first clock signal, the input circuit is turned off;
- the voltage of the first node remains substantially unchanged, and under the control of the voltage of the first node, the output circuit remains in an on state and transmits another level of the second clock signal to the output signal terminal;
- under the control of the voltage of the first node and the another level of the second clock signal, the first control circuit transmits the first voltage signal to the second node, so as to control the voltage of the second node; and
- under the control of the voltage of the second node, the holding circuit is turned off;
- the second period includes a first holding period and a second holding period;
- in the first holding period, in response to the level of the first clock signal, the input circuit is turned on and transmits the another level of the input signal to the first node;
- under the control of the voltage of the first node, the output circuit is turned off;
- under the control of the voltage of the first node and the level of the second clock signal, the first control circuit transmits the level of the second clock signal to the second node, so as to control the voltage of the second node; and
- under the control of the voltage of the second node, the holding circuit is turned off;
- in the second holding period, in response to the another level of the first clock signal, the input circuit is turned off;
- the voltage of the first node remains substantially unchanged, and under the control of the voltage of the first node, the output circuit remains in an off state;
- under the control of the voltage of the first node and the another level of the second clock signal, the first control circuit transmits the another level of the second clock signal to the second node, so as to control the voltage of the second node; and
- under the control of the voltage of the second node, the holding circuit is turned on and transmits the first voltage signal to the output signal terminal.

12. The method of driving the shift register according to claim 10, wherein the first clock signal and the second clock signal are inverted signals.

13. A scan driving circuit, comprising a plurality of shift registers connected in cascade according to claim 1, wherein
- except for last i shift registers, an output signal terminal of an Nth shift register is electrically connected to an input signal terminal of an (N+i)th shift register, wherein N and i are both positive integers, and i is less than N.

14. The scan driving circuit according to claim 13, further comprising at least one first clock signal line and at least one second clock signal line, wherein
- i is equal to 1;
- a first clock signal line is electrically connected to a first clock signal terminal of a (2N−1)th shift register and a second clock signal terminal of a (2N)th shift register; and
- a second clock signal line is electrically connected to a second clock signal terminal of the (2N−1)th shift register and a first clock signal terminal of the (2N)th shift register.

15. A display device, comprising the scan driving circuit according to claim 13.

* * * * *